United States Patent
Yamasaki et al.

(10) Patent No.: US 10,639,893 B2
(45) Date of Patent: May 5, 2020

(54) PIEZOELECTRIC DEVICE, LIQUID DISCHARGING HEAD, AND LIQUID DISCHARGING APPARATUS

(71) Applicant: SEIKO EPSON CORPORATION, Tokyo (JP)

(72) Inventors: Sayaka Yamasaki, Chino (JP); Hiroaki Tamura, Shimosuwa (JP)

(73) Assignee: Seiko Epson Corporation, Tokyo (JP)

( * ) Notice: Subject to any disclaimer, the term of this patent is extended or adjusted under 35 U.S.C. 154(b) by 113 days.

(21) Appl. No.: 15/988,971

(22) Filed: May 24, 2018

(65) Prior Publication Data
US 2018/0339515 A1 Nov. 29, 2018

(30) Foreign Application Priority Data
May 29, 2017 (JP) ................................. 2017-105592

(51) Int. Cl.
*H01L 41/09* (2006.01)
*B41J 2/14* (2006.01)

(52) U.S. Cl.
CPC ....... *B41J 2/14274* (2013.01); *B41J 2/14233* (2013.01); *H01L 41/0973* (2013.01); *B41J 2002/14241* (2013.01); *B41J 2002/14419* (2013.01); *B41J 2202/03* (2013.01); *B41J 2202/11* (2013.01)

(58) Field of Classification Search
USPC ................................................ 310/324, 328
See application file for complete search history.

(56) References Cited

U.S. PATENT DOCUMENTS

2008/0136873 A1* 6/2008 Baek ........................ B41J 2/055
  347/68
2010/0231650 A1* 9/2010 Mita .................... B41J 2/14201
  347/48

(Continued)

FOREIGN PATENT DOCUMENTS

EP    1231061 A1    8/2002
EP    1733883 A2   12/2006
(Continued)

OTHER PUBLICATIONS

Partial European Search Report issued in Application No. 18174148 dated Sep. 27, 2018.

(Continued)

*Primary Examiner* — Thomas M Dougherty
(74) *Attorney, Agent, or Firm* — Workman Nydegger

(57) ABSTRACT

There is provided a piezoelectric device including a pressure chamber, a piezoelectric element, and a diaphragm disposed between the pressure chamber and the piezoelectric element. The diaphragm has a crystal plane of an anisotropic single crystal silicon base of which a Young's modulus varies according to a direction in the crystal plane. In a vibration region of the diaphragm, which overlaps the pressure chamber in plan view, a first Young's modulus in a first direction, out of Young's modulus in the crystal plane, is higher than a second Young's modulus in the crystal plane in a second direction intersecting the first direction. A width of the piezoelectric element in the first direction is larger than a width of the piezoelectric element in the second direction.

18 Claims, 11 Drawing Sheets

(56) References Cited

U.S. PATENT DOCUMENTS

| | | |
|---|---|---|
| 2010/0238216 A1 | 9/2010 | Tsukamoto |
| 2015/0085022 A1 | 3/2015 | Kawakubo et al. |
| 2017/0119351 A1 | 5/2017 | Yamasaki et al. |
| 2018/0342665 A1* | 11/2018 | Yamasaki ............ B41J 2/14233 |

FOREIGN PATENT DOCUMENTS

| | | |
|---|---|---|
| JP | 2002-67307 A | 3/2002 |
| JP | 2007-127137 A | 5/2007 |
| JP | 2011066197 A | 3/2011 |

OTHER PUBLICATIONS

European Search Report issued in Application No. 18174148 dated Jan. 4, 2019.

* cited by examiner

PIEZOELECTRIC DEVICE, LIQUID DISCHARGING HEAD, AND LIQUID DISCHARGING APPARATUS

The entire disclosure of Japanese Patent Application No. 2017-105592, filed May 29, 2017, is expressly incorporated by reference herein.

BACKGROUND

1. Technical Field

The present invention relates to a technique in which a piezoelectric device causes a pressure change.

2. Related Art

A liquid discharging head that discharges, from nozzles, a liquid such as an ink supplied to a pressure chamber by a piezoelectric device causing a pressure change in the pressure chamber is proposed in the related art. For example, a technique, in which a piezoelectric device including a diaphragm configuring a wall surface (top surface) of a pressure chamber and a piezoelectric element vibrating the diaphragm is provided for each pressure chamber, is disclosed in JP-A-2002-67307. An active layer substrate (portion that deforms due to vibration) of the diaphragm is configured of a silicon base of which a Young's modulus changes according to a direction in a crystal plane. In JP-A-2002-67307, the diaphragm is made likely to deform in a lateral direction by aligning the lateral direction of the diaphragm with a direction where a Young's modulus of the diaphragm in the lateral direction is lower than a Young's modulus in a longitudinal direction in the crystal plane.

However, in a case where the diaphragm is configured of a silicon substrate, of which a Young's modulus changes according to a direction in a crystal plane, as in JP-A-2002-67307, the diaphragm is unlikely to be displaced in a crystal orientation in which a Young's modulus is high. Thus, there is a possibility that the displacement of the diaphragm is inhibited as a whole. For example, in the silicon substrate of which the crystal plane is a (100) plane, a Young's modulus is maximum at an angle of 45 degrees from an angle where a Young's modulus is minimum. For this reason, if a crystal orientation in which a Young's modulus is high is included in the diaphragm, the displacement of the entire diaphragm cannot be sufficiently improved simply by aligning a direction of the diaphragm according to a Young's modulus in the lateral direction and a Young's modulus in the longitudinal direction, as in JP-A-2002-67307.

SUMMARY

An advantage of some aspects of the invention is to improve the displacement efficiency of a diaphragm.

According to an aspect of the invention, there is provided a piezoelectric device including a pressure chamber, a piezoelectric element, and a diaphragm disposed between the pressure chamber and the piezoelectric element. The diaphragm has a crystal plane of an anisotropic single crystal silicon base of which a Young's modulus varies according to a direction in the crystal plane. In a vibration region of the diaphragm, which overlaps the pressure chamber in plan view, a first Young's modulus in a first direction, out of Young's modulus in the crystal plane, is higher than a second Young's modulus in the crystal plane in a second direction intersecting the first direction. A width of the piezoelectric element in the first direction is larger than a width of the piezoelectric element in the second direction. According to this configuration, since the width of the piezoelectric element in the first direction where a Young's modulus is high in the crystal plane is larger than the width of the piezoelectric element in the second direction where a Young's modulus is low in the crystal plane, an area where the piezoelectric element is driven in a direction where a Young's modulus is high, which is a direction where the displacement of the diaphragm is likely to be obstructed, can be made wider than an area where the piezoelectric element is driven in a direction where a Young's modulus is low. Accordingly, since a deflection amount in an in-plane direction where a Young's modulus is high can be increased, the same amount as a deflection amount in the in-plane direction where a Young's modulus is low can be applied. Consequently, since an even strain can occur in the entire diaphragm, the entire diaphragm is likely to be displaced and thus the displacement efficiency of the diaphragm can be improved.

In the piezoelectric device, the width of the piezoelectric element may be a width of a portion of the piezoelectric element, which overlaps the pressure chamber in plan view. According to this configuration, since the width of the portion of the piezoelectric element, which overlaps the pressure chamber in plan view, can be made larger in a direction where a Young's modulus is high in the crystal plane than in a direction where a Young's modulus is low in the crystal plane, a deflection amount of the vibration region of the diaphragm, which is displaced with the piezoelectric element, in the in-plane direction can be increased. Thus, the displacement efficiency of the entire diaphragm can be improved.

In the piezoelectric device, the width of the piezoelectric element may be a width of a portion of the piezoelectric element, which overlaps a side wall of the pressure chamber in plan view. According to this configuration, since the width of the portion of the piezoelectric element, which overlaps the side wall of the pressure chamber in plan view, can be made larger in a direction where a Young's modulus is high in the crystal plane than in a direction where a Young's modulus is low in the crystal plane, a deflection amount of the vibration region of the diaphragm, which is close to the side wall of the pressure chamber, in the in-plane direction can be increased. Thus, the displacement efficiency of the entire diaphragm can be improved.

According to another aspect of the invention, there is provided a piezoelectric device including a pressure chamber, a piezoelectric element, and a diaphragm disposed between the pressure chamber and the piezoelectric element. The diaphragm has a vibration region that overlaps the pressure chamber in plan view. A width of the piezoelectric element in a direction of a short axis of the smallest rectangle, which includes the vibration region, is larger than a width of the pressure chamber in a direction of a long axis of the rectangle. According to this configuration, since the width of the piezoelectric element in the direction of the short axis of the smallest rectangle, which includes the vibration region, is larger than the width of the pressure chamber in the direction of the long axis of the rectangle, an area where the piezoelectric element is driven in the direction of the short axis, which is a direction where the displacement of the diaphragm is likely to be obstructed, can be made wider than an area where the piezoelectric element is driven in the direction of the long axis. Accordingly, since a deflection amount can be increased in the direction of the short axis, the same amount as a deflection amount in the direction of the long axis can be applied. Consequently, an even strain can occur in the entire diaphragm. Therefore, the entire diaphragm is likely to be displaced, and thus the displacement efficiency of the diaphragm can be improved.

In the piezoelectric device, the width of the piezoelectric element may be a width of a portion of the piezoelectric element, which overlaps the pressure chamber in plan view. According to this configuration, since the width of the portion of the piezoelectric element, which overlaps the pressure chamber in plan view, can be made larger in the direction of the short axis of the vibration region than in the direction of the long axis, a deflection amount of the vibration region of the diaphragm, which is displaced with the piezoelectric element, in the in-plane direction can be increased. Thus, the displacement efficiency of the entire diaphragm can be improved.

In the piezoelectric device, the width of the piezoelectric element may be a width of a portion of the piezoelectric element, which overlaps a side wall of the pressure chamber in plan view. According to this configuration, since the width of the portion of the piezoelectric element, which overlaps the side wall of the pressure chamber in plan view, can be made larger in the direction of the short axis of the vibration region than in the direction of the long axis, a deflection amount of the vibration region of the diaphragm, which is close to the side wall of the pressure chamber, in the in-plane direction can be increased. Thus, the displacement efficiency of the entire diaphragm can be improved.

According to still another aspect of the invention, there is provided a piezoelectric device including a pressure chamber, a piezoelectric element, and a diaphragm disposed between the pressure chamber and the piezoelectric element. The diaphragm has a crystal plane of an anisotropic single crystal silicon base of which a Young's modulus varies according to a direction in the crystal plane. In a vibration region of the diaphragm, which overlaps the pressure chamber in plan view, a first Young's modulus in a first direction, out of Young's modulus in the crystal plane, is higher than a second Young's modulus in the crystal plane in a second direction intersecting the first direction. A first width of the piezoelectric element in the first direction is larger than a second width of the piezoelectric element in the second direction. A width of the piezoelectric element in a direction of a short axis of the smallest rectangle, which includes the vibration region, is larger than a width of the pressure chamber in a direction of a long axis of the rectangle. The first width and the second width are larger than a width of the piezoelectric element in the direction of the long axis. According to this configuration, since the width of the piezoelectric element is larger in a direction where a Young's modulus is high in the crystal plane than in a direction where a Young's modulus is low in the crystal plane and the width of the piezoelectric element is larger in the direction of the short axis of the vibration region than in the direction of the long axis, an area where the piezoelectric element is driven in a direction where the displacement of the diaphragm is likely to be obstructed can be made wider. Accordingly, since a displacement amount can be increased in the in-plane direction where the diaphragm is unlikely to be deformed, an even strain can occur in the entire diaphragm. Therefore, the entire diaphragm is likely to be displaced, and thus the displacement efficiency of the diaphragm can be improved. In addition, by making the first width and the second width larger than the width of the piezoelectric element in the direction of the long axis, the width of the piezoelectric element can be made larger with priority given to a direction of the Young's modulus rather than an axial direction of the vibration region. Thus, the displacement efficiency of the entire diaphragm can be improved.

In the piezoelectric device, the piezoelectric element may be disposed on the diaphragm so as to overlap an inner periphery of the pressure chamber without overlapping a center of the pressure chamber in plan view, and the piezoelectric element may have an inner edge on a center side of the pressure chamber and has an outer edge on a side wall side of the pressure chamber with the inner periphery of the pressure chamber being sandwiched between the outer edge and the inner edge in plan view. According to this configuration, the width of the piezoelectric element can be changed according to the shape of the inner edge and the shape of the outer edge of the pressure chamber. It is easy to change the width of the piezoelectric element according to a direction since the piezoelectric element is disposed around the center of the pressure chamber.

In the piezoelectric device, an entire perimeter of the piezoelectric element may overlap an entire perimeter of the inner periphery of the pressure chamber in plan view. According to this configuration, since the entire perimeter of the piezoelectric element overlaps the entire perimeter of the inner periphery of the pressure chamber in plan view, an even strain is likely to occur in the entire diaphragm by changing the width of the piezoelectric element according to a direction. Accordingly, the entire diaphragm is likely to be displaced, and thus the displacement efficiency of the diaphragm can be improved.

In the piezoelectric device, a shape of the inner edge or the outer edge of the piezoelectric element may be a polygon or a circle in plan view. According to this configuration, even in a case where the shape of the inner edge or the outer edge of the piezoelectric element is various shapes such as a polygon and a circle in plan view, the displacement efficiency of the entire diaphragm can be improved.

In the piezoelectric device, a shape of the inner periphery of the pressure chamber may be a polygon or a circle in plan view. According to this configuration, even in a case where the shape of the inner periphery of the pressure chamber is various shapes such as a polygon and a circle in plan view, the displacement efficiency of the entire diaphragm can be improved.

In the piezoelectric device, the single crystal silicon base may be a base of which the crystal plane is a {100} plane, the first direction may lie along a crystal orientation <011> in the crystal plane, and the second direction may lie along a crystal orientation <001> in the crystal plane. According to this configuration, in the {100} plane, the width of the piezoelectric element can be made larger in the first direction along the crystal orientation <011> in which a Young's modulus is maximum than in the second direction along the crystal orientation <001> in which a Young's modulus is minimum. Accordingly, an area where the piezoelectric element is driven in a direction where a Young's modulus is high, which is a direction where the displacement of the diaphragm is likely to be obstructed, can be made wider than an area where the piezoelectric element is driven in a direction where a Young's modulus is low. Therefore, since a deflection amount in the in-plane direction where a Young's modulus is high can be increased, the same amount as a deflection amount in the in-plane direction where a Young's modulus is low can be applied. Consequently, since an even strain can occur in the entire diaphragm, the entire diaphragm is likely to be displaced and thus the displacement efficiency of the diaphragm can be improved.

In the piezoelectric device, the single crystal silicon base may be a base of which the crystal plane is a {110} plane, the first direction may lie along a crystal orientation <111> in the crystal plane, and the second direction may lie along a crystal orientation <001> in the crystal plane. According to this configuration, in the {110} plane, the width of the piezoelectric element can be made larger in the first direction along the crystal orientation <111> in which a Young's modulus is maximum than in the second direction along the crystal orientation <001> in which a Young's modulus is minimum. Accordingly, an area where the piezoelectric element is driven in a direction where a Young's modulus is high, which is a direction where the displacement of the diaphragm is likely to be obstructed, can be made wider than an area where the piezoelectric element is driven in a direction where a Young's modulus is low. Therefore, since a deflection amount in the in-plane direction where a Young's modulus is high can be increased, the same amount as a deflection amount in the in-plane direction where a Young's modulus is low can be applied. Consequently, since an even strain can occur in the entire diaphragm, the entire diaphragm is likely to be displaced and thus the displacement efficiency of the diaphragm can be improved.

In the piezoelectric device, an outer surface of the diaphragm may be configured of a crystal plane {111} of an isotropic single crystal silicon base of which a Young's modulus is the same regardless of a direction in the crystal plane. According to this configuration, even in a case where the outer surface of the diaphragm is configured of the crystal plane {111} of the isotropic single crystal silicon base of which the Young's modulus is the same regardless of a direction in the crystal plane, the entire diaphragm is likely to be displaced and thus the displacement efficiency of the diaphragm can be improved by making the width of the piezoelectric element in the direction of the short axis of the vibration region larger than the width of the pressure chamber in the direction of the long axis.

According to still another aspect of the invention, there is provided a liquid discharging head including the piezoelectric device according to any one of the aspects described above. A liquid that has filled the pressure chamber is discharged from a nozzle by the piezoelectric element vibrating the diaphragm to change a pressure of the pressure chamber. According to this configuration, the liquid discharging head including the piezoelectric device that can improve the displacement efficiency of the diaphragm can be provided.

According to still another aspect of the invention, there is provided a liquid discharging apparatus including the piezoelectric device according to any one of the aspects described above. A liquid that has filled the pressure chamber is discharged from a nozzle by the piezoelectric element vibrating the diaphragm to change a pressure of the pressure chamber. According to this configuration, the liquid discharging apparatus including the piezoelectric device that can improve the displacement efficiency of the diaphragm can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
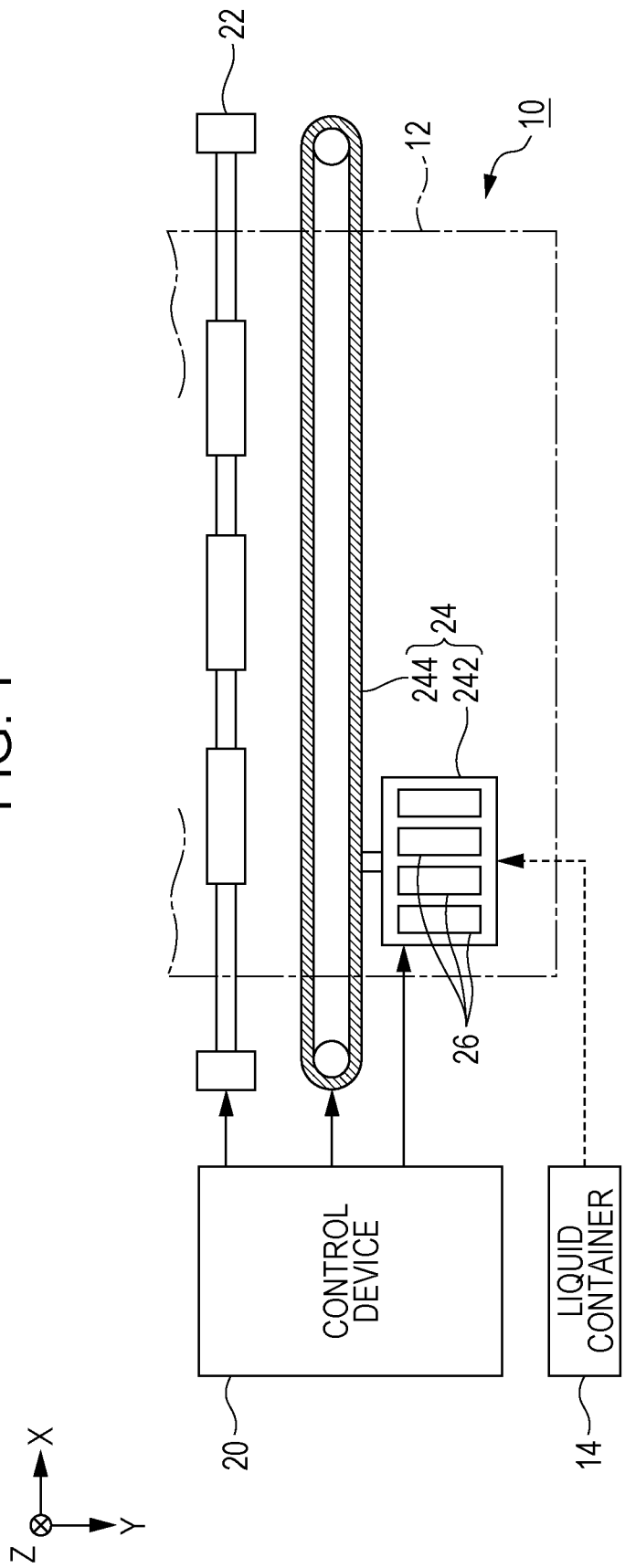
FIG. 1 is a view illustrating a configuration of a liquid discharging apparatus according to a first embodiment of the invention.

FIG. 1 is a view illustrating a configuration of a liquid discharging apparatus 10 according to a first embodiment of the invention. The liquid discharging apparatus 10 of the first embodiment is an ink jet printing apparatus that discharges an ink, which is an example of a liquid, onto a medium 12. Although the medium 12 is typical printing paper, any printing target such as a resin film and cloth can be used as the medium 12. As illustrated in FIG. 1, a liquid container 14 storing an ink is fixed to the liquid discharging apparatus 10. For example, a cartridge that is attachable/detachable to/from the liquid discharging apparatus 10, a bag-like ink pack formed of a flexible film, or an ink tank that can be refilled with an ink is used as the liquid container 14. A plurality of types of inks having different colors are stored in the liquid container 14.

As illustrated in FIG. 1, the liquid discharging apparatus 10 includes a control device 20, a transporting mechanism 22, a moving mechanism 24, and a plurality of liquid discharging heads 26. The control device 20 includes, for example, a processing circuit, such as a central processing unit (CPU) and a field programmable gate array (FPGA), and a memory circuit, such as a semiconductor memory, and comprehensively controls each element of the liquid discharging apparatus 10. The transporting mechanism 22 transports the medium 12 in a Y-direction under the control of the control device 20.

The moving mechanism 24 causes the plurality of liquid discharging heads 26 to reciprocate in an X-direction under the control of the control device 20. The X-direction is a direction intersecting (typically orthogonal to) the Y-direction in which the medium 12 is transported. The moving mechanism 24 includes a carriage 242 on which the plurality of liquid discharging heads 26 are mounted and an endless belt 244 to which the carriage 242 is fixed. It is also possible to mount the liquid container 14 on the carriage 242 with the liquid discharging heads 26.

Each of the plurality of liquid discharging heads 26 discharges an ink, which is supplied from the liquid container 14, onto the medium 12 from a plurality of nozzles (discharge holes) N under the control of the control device 20. A desired image is formed on an outer surface of the medium 12 by each of the liquid discharging heads 26 discharging an ink onto the medium 12 as the transportation of the medium 12 by the transporting mechanism 22 and the repeated reciprocation of the carriage 242 are performed at the same time. Hereinafter, a direction perpendicular to an XY-plane (for example, a plane parallel to the outer surface of the medium 12) will be referred to as a Z-direction. A direction (typical vertical direction), in which an ink is discharged by each of the liquid discharging heads 26, corresponds to the Z-direction.

Liquid Discharging Head

Figure 2:
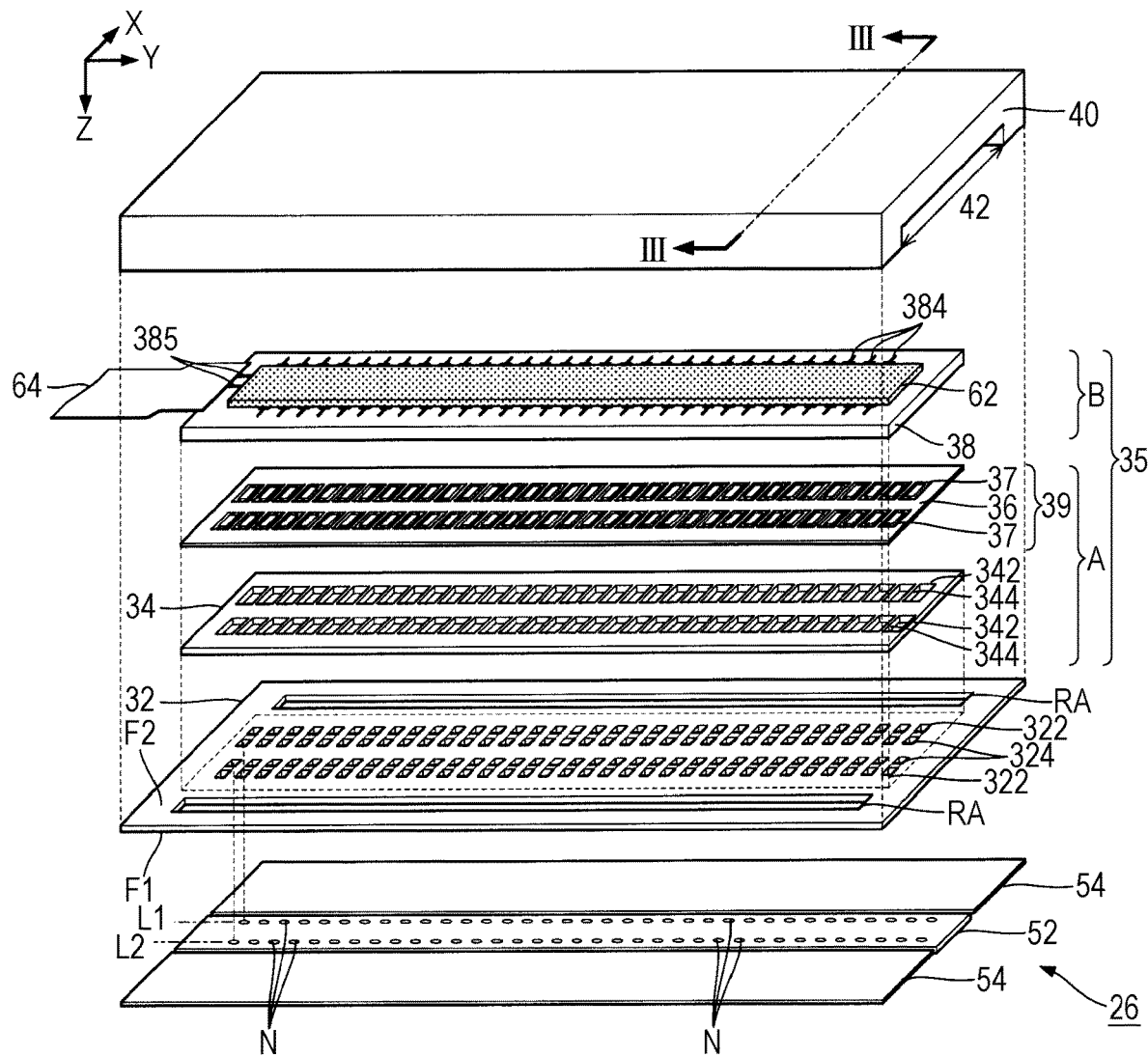
FIG. 2 is an exploded perspective view of a liquid discharging head.
Figure 3:
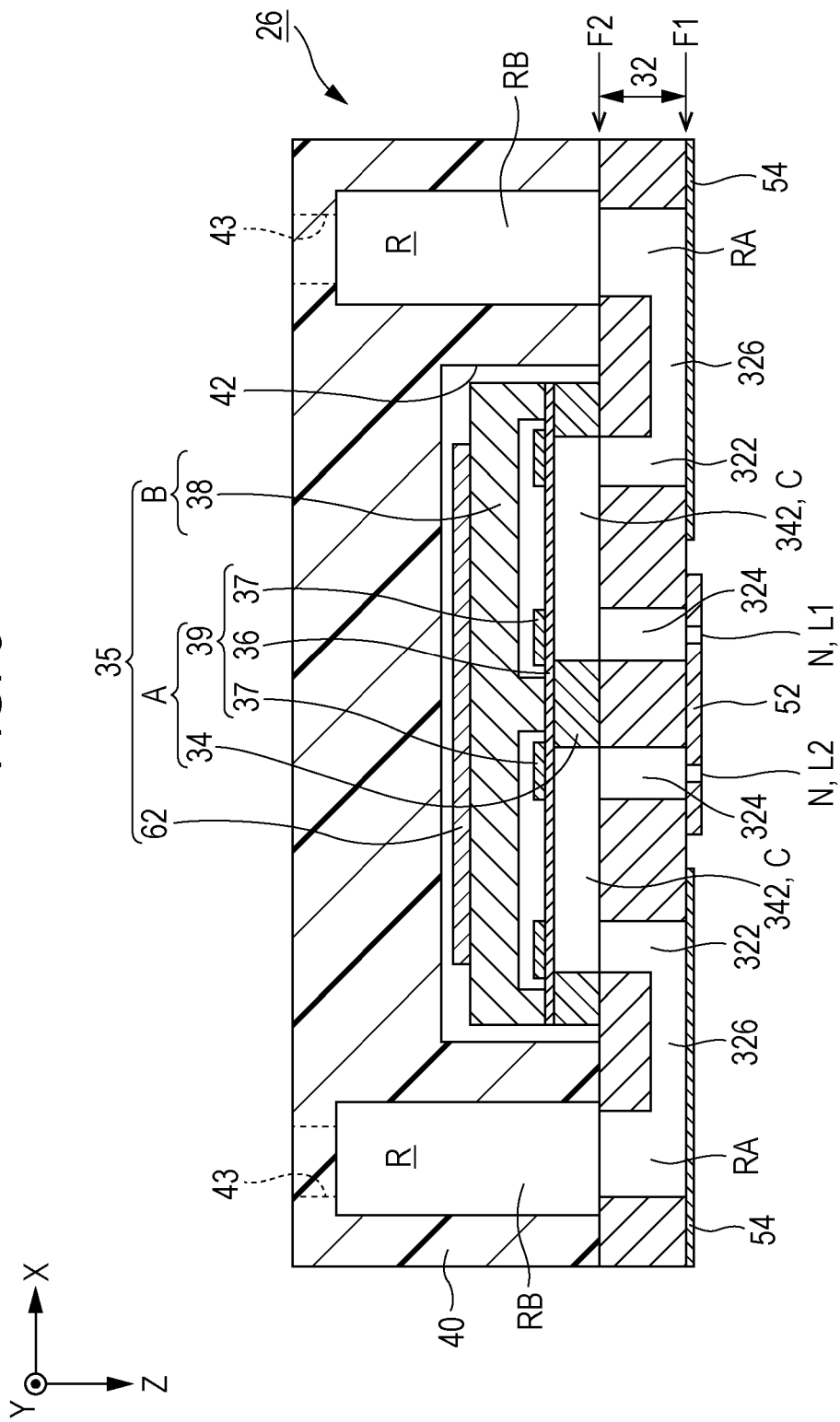
FIG. 3 is a sectional view of the liquid discharging head illustrated in FIG. 2 taken along line III-III.

FIG. 2 is an exploded perspective view of any one of the liquid discharging heads 26, and FIG. 3 is a sectional view taken along line III-III of FIG. 2. As illustrated in FIG. 2, the liquid discharging head 26 includes the plurality of nozzles N arranged in the Y-direction. The plurality of nozzles N of the first embodiment are classified into a first line L1 and a second line L2. Although it is also possible to make the positions of the nozzles N in the Y-direction different from each other between the first line L1 and the second line L2 (that is, zigzag disposition or staggered disposition), a configuration where the positions of the nozzles N in the Y-direction match the first line L1 and the second line L2 is given as an example in FIG. 3 for convenience. As illustrated in FIG. 2, the liquid discharging head 26 has a structure in which elements related to the plurality of nozzles N in the first line L1 and elements related to the plurality of nozzles N in the second line L2 are disposed so as to be substantially linearly symmetric to each other.

As illustrated in FIGS. 2 and 3, the liquid discharging head 26 includes a flow path substrate 32. The flow path substrate 32 is a plate-like member including an outer surface F1 and an outer surface F2. The outer surface F1 is an outer surface (outer surface on a medium 12 side) on a positive side of the Z-direction, and the outer surface F2 is an outer surface on a side (negative side of the Z-direction) opposite to the outer surface F1. A pressure generating unit 35 and a case member 40 are provided on the outer surface F2 of the flow path substrate 32, and a nozzle plate 52 and compliance substrates 54 are provided on the outer surface F1. Each element of the liquid discharging head 26 is a substantially plate-like member which is long in the Y-direction just as the flow path substrate 32. The elements are bonded to each other using, for example, an adhesive. It is also possible to perceive a direction, in which the flow path substrate 32 and a pressure chamber substrate 34 are stacked, as the Z-direction.

The pressure generating unit 35 is an element that causes a pressure change for discharging inks from the nozzles N. The pressure generating unit 35 of the embodiment is configured by a first substrate A including the pressure chamber substrate 34 and the piezoelectric device 39, a second substrate B including a wiring connection substrate (protection substrate) 38, and a drive IC 62 being bonded to each other. The piezoelectric device 39 is formed of pressure chambers C (to be described later) formed in the pressure chamber substrate 34, piezoelectric elements 37, and a diaphragm 36 disposed between the pressure chambers C and the piezoelectric elements 37, and is an element that causes a pressure change in the pressure chambers C by vibration. Details of the pressure generating unit 35 and the piezoelectric device 39 will be described later.

The nozzle plate 52 is a plate-like member in which the plurality of nozzles N are formed, and is provided on the outer surface F1 of the flow path substrate 32 using, for example, an adhesive. Each of the nozzles N is a through-hole through which an ink passes. The nozzle plate 52 of the first embodiment is manufactured by processing a single crystal silicon (Si) base (silicon substrate) using a semiconductor manufacturing technique. However, any known material or any known manufacturing method can be adopted in manufacturing the nozzle plate 52.

The flow path substrate 32 is a plate-like member for forming a flow path of an ink. As illustrated in FIGS. 2 and 3, a space RA, a plurality of supply flow paths 322, and a plurality of communication flow paths 324 are formed for each of the first line L1 and the second line L2 in the flow path substrate 32. The spaces RA are long openings which run in the Y-direction in plan view (that is, seen from the Z-direction), and the supply flow path 322 and the communication flow path 324 are through-holes formed for each of the nozzles N. The plurality of supply flow paths 322 are arranged in the Y-direction, and the plurality of communication flow paths 324 are also arranged in the Y-direction. As illustrated in FIG. 3, intermediate flow paths 326 which reach the plurality of supply flow paths 322 are formed in the outer surface F1 of the flow path substrate 32. Each of the intermediate flow paths 326 is a flow path connecting the space RA and the plurality of supply flow paths 322 together. The communication flow paths 324 communicate with the nozzles N.

The wiring connection substrate 38 of FIGS. 2 and 3 is a plate-like member for protecting the plurality of piezoelectric elements 37, and is provided on an outer surface (outer surface on a side opposite to the pressure chambers C) of the diaphragm 36. Although any material or any manufacturing method can be used for the wiring connection substrate 38, the wiring connection substrate 38 can be formed by processing a single crystal silicon (Si) base (silicon substrate) using a semiconductor manufacturing technique as in the case of the flow path substrate 32 and the pressure chamber substrate 34. As illustrated in FIGS. 2 and 3, the drive IC 62 is provided on an outer surface of the wiring connection substrate 38 (hereinafter, referred to as a "mount surface") on a side opposite to the outer surface (hereinafter, referred to as a "bonded surface") on a diaphragm 36 side. The drive IC 62 is a substantially rectangular IC chip on which a drive circuit that drives each of the piezoelectric elements 37 by generating and supplying a drive signal under the control of the control device 20 is mounted. On the mount surface of the wiring connection substrate 38, wiring 384 connected to an output terminal for a drive signal (drive voltage) of the drive IC 62 is formed for each of the piezoelectric elements 37. In addition, each of wiring pieces 385 connected to an output terminal for a base voltage (base voltage of a drive signal of each of the piezoelectric elements 37) of the drive IC 62 is consecutively formed on the mount surface of the wiring connection substrate 38 along the disposition of the piezoelectric elements 37 in the Y-direction.

The case member 40 illustrated in FIGS. 2 and 3 is a case for storing an ink to be supplied to the plurality of pressure chambers C (furthermore, the plurality of nozzles N). An outer surface of the case member 40 on the positive side of the Z-direction is fixed to the outer surface F2 of the flow path substrate 32 with, for example, an adhesive. As illustrated in FIGS. 2 and 3, a grooved recessed portion 42 extending in the Y-direction is formed in the outer surface of the case member 40 on the positive side of the Z-direction. The wiring connection substrate 38 and the drive IC 62 are accommodated inside the recessed portion 42. The case member 40 is formed of a material different from materials of the flow path substrate 32 and the pressure chamber substrate 34. It is possible to manufacture the case member 40 with, for example, a resin material by injection molding. However, any known material or any known manufacturing method can be adopted in manufacturing the case member 40. For example, a synthetic fiber or a resin material is suitable as a material of the case member 40.

As illustrated in FIG. 3, a space RB is formed for each of the first line L1 and the second line L2 in the case member 40. The spaces RB of the case member 40 and the spaces RA of the flow path substrate 32 communicate with each other. A space configured of the space RA and the space RB functions as a liquid storing chamber (reservoir) R storing an ink to be supplied to the plurality of pressure chambers C. The liquid storing chamber R is a common liquid chamber that reaches the plurality of nozzles N. An inlet 43 for causing an ink to be supplied from the liquid container 14 to flow into the liquid storing chamber R is formed for each of the first line L1 and the second line L2 in the outer surface of the case member 40 on a side opposite to the flow path substrate 32.

An ink supplied from the liquid container 14 to the inlet 43 is stored in the space RB and the space RA of the liquid storing chamber R. The ink stored in the liquid storing chamber R is divided into the plurality of supply flow paths 322 from the intermediate flow paths 326 so as to be supplied to and so as to fill each of the pressure chambers C in parallel.

As illustrated in FIG. 2, the compliance substrates 54 are provided on the outer surface F1. The compliance substrates 54 are flexible films that absorb a pressure change of an ink in the liquid storing chambers R. As illustrated in FIG. 3, the compliance substrates 54 are provided on the outer surface F1 of the flow path substrate 32 so as to close the spaces RA of the flow path substrate 32, the intermediate flow paths 326, and the plurality of supply flow paths 322, and configure wall surfaces (specifically, bottom surfaces) of the liquid storing chamber R.

The pressure generating unit 35 illustrated in FIG. 3 is configured by stacking the first substrate A, the second substrate B, and the drive IC 62. The first substrate A is a substrate that includes the pressure chamber substrate 34, the diaphragm 36, and the plurality of piezoelectric elements 37, and the second substrate B is a substrate that includes the wiring connection substrate 38.

The pressure chamber substrate 34 is a plate-like member, in which a plurality of openings 342 configuring the pressure chambers C are formed for each of the first line L1 and the second line L2, and is provided on the outer surface F2 of the flow path substrate 32 using, for example, an adhesive. The plurality of openings 342 are arranged in the Y-direction. Each of the openings 342 is a through-hole, which is formed for each of the nozzles N and runs in the X-direction in plan view. The flow path substrate 32 and the pressure chamber substrate 34 are manufactured by processing single crystal silicon (Si) substrates (silicon substrates) using a semiconductor manufacturing technique as in the case of the nozzle plate 52 described above. However, any known material and any known method can be adopted in manufacturing the flow path substrate 32 and the pressure chamber substrate 34. The piezoelectric device 39 is provided on an outer surface of the pressure chamber substrate 34 on a side opposite to the flow path substrate 32.

Piezoelectric Device

Figure 4:
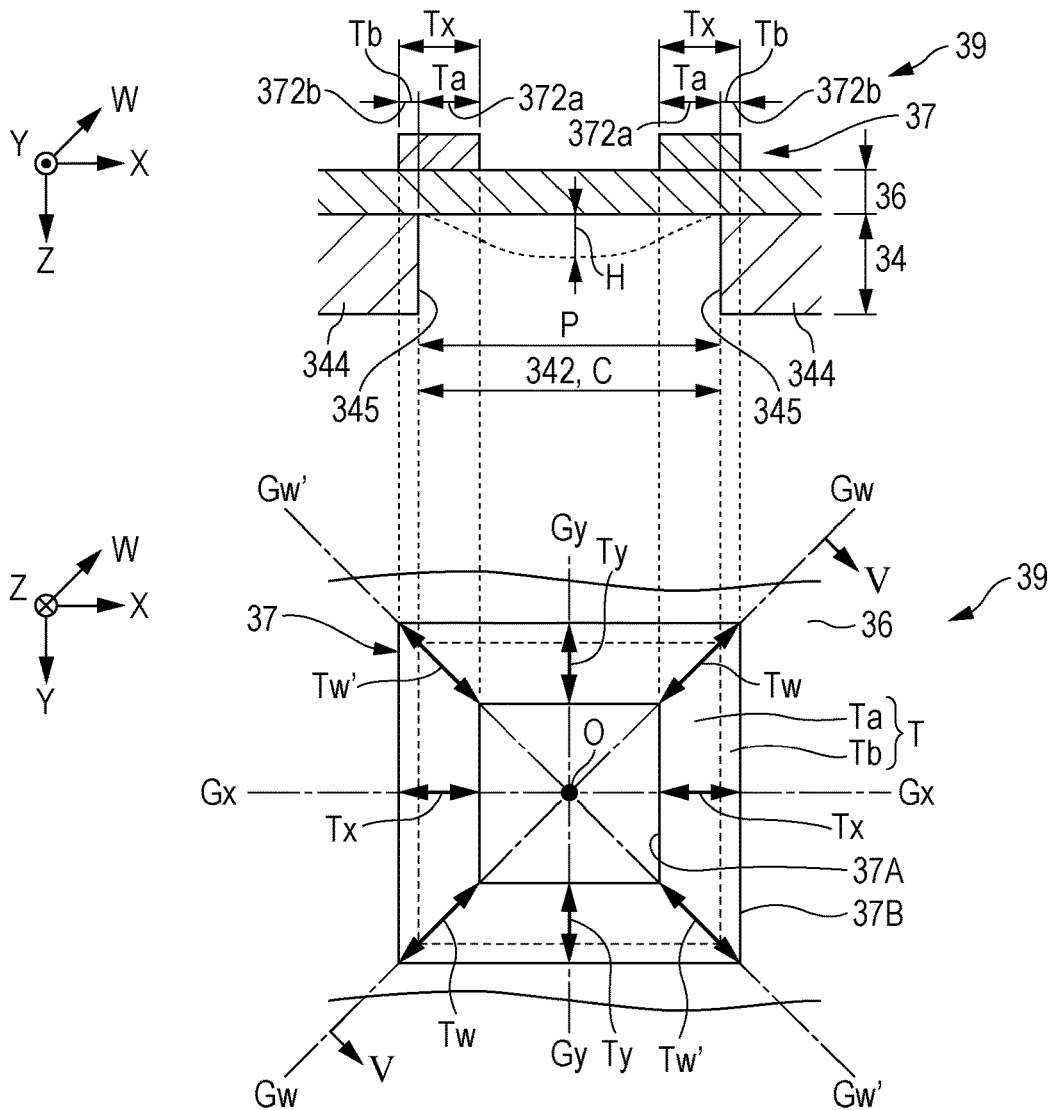
FIG. 4 is a sectional view and a plan view of a piezoelectric device.
Figure 5:
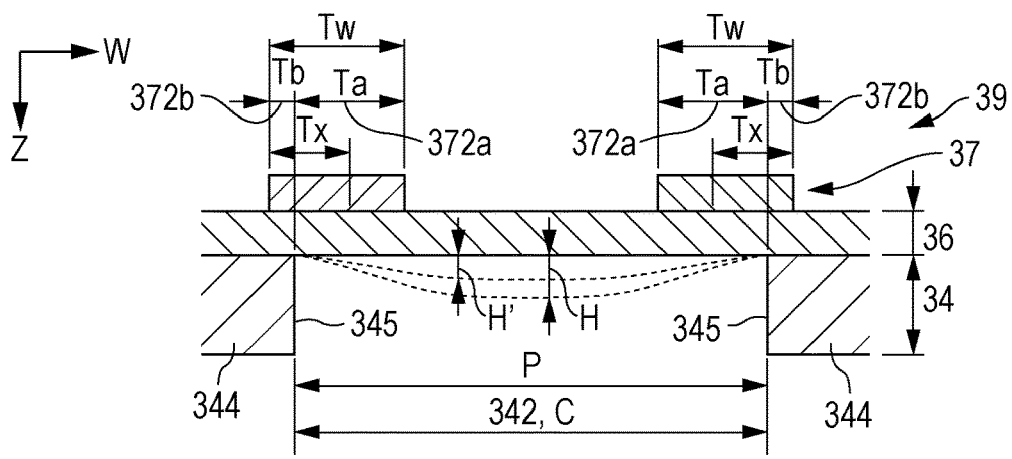
FIG. 5 is a sectional view of the piezoelectric device illustrated in FIG. 4 taken along line V-V.

FIG. 4 is a sectional view and a plan view of the enlarged piezoelectric device 39. The sectional view (view on the upper side of FIG. 4) of FIG. 4 is a view obtained by cutting the piezoelectric device 39 with an XZ-plane, and the plan view (view on the lower side of FIG. 4) of FIG. 4 is a view in which the piezoelectric device 39 is seen from the Z-direction. FIG. 5 is a sectional view of the piezoelectric device 39 illustrated in FIG. 4 taken along line V-V. A W direction of FIGS. 4 and 5 is a direction where an angle of 45 degrees is formed counterclockwise from the X-direction, and is a direction along an axis Gw to be described later.

As illustrated in FIGS. 4 and 5, the piezoelectric device 39 is formed of the pressure chambers C, the piezoelectric elements 37, and the diaphragm 36, and causes a pressure change in each of the pressure chambers C by the piezoelectric elements 37 vibrating the diaphragm 36. The shape of the inner periphery 345 of the pressure chamber C of FIG. 4 is a square. Specifically, the shape of the inner periphery 345 of the pressure chamber C is a square in plan view. The shape of the inner periphery 345 of the pressure chamber C is the shape of the inner periphery 345 of a side wall 344 of the pressure chamber C in plan view seen from the Z-direction, and defines a vibration region P of the diaphragm 36. The vibration region P of the diaphragm 36 is a region of the diaphragm 36, which overlaps the pressure chamber C in plan view, and is a region that configures a wall surface (top surface) of the pressure chamber C.

The piezoelectric element 37 of FIG. 4 is a square-annular element of which the shape of an inner edge 37A is a square and the shape of an outer edge 37B is a square larger than the square of the inner edge 37A in plan view (seen from the Z-direction). Specifically, the piezoelectric element 37 is disposed on the diaphragm 36 so as to overlap the inner periphery 345 of the pressure chamber C without overlapping a center O of the pressure chamber C in plan view. The piezoelectric element has the inner edge 37A on a center O side of the pressure chamber C and has the outer edge 37B on a side wall 344 side of the pressure chamber C with the inner periphery 345 of the pressure chamber C being sandwiched between the outer edge and the inner edge. A case where the entire perimeter of the piezoelectric element 37 is annularly formed so as to overlap the entire perimeter of the inner periphery 345 of the pressure chamber C in plan view is given as an example in FIG. 4. However, the piezoelectric elements 37 may have a configuration of overlapping some parts of the inner peripheries 345 instead of the entire perimeters of the inner peripheries 345 of the pressure chambers C.

As illustrated in FIGS. 2 and 3, the outer surface F2 of the flow path substrate 32 and the diaphragm 36 face each other at an interval inside each of the openings 342. A space positioned inside each of the openings 342 between the outer surface F2 of the flow path substrate 32 and the diaphragm 36 functions as each of the pressure chambers C for applying a pressure to an ink which has filled the space. The pressure chamber C is separately formed for each of the nozzles N. As illustrated in FIG. 2, the plurality of pressure chambers C (openings 342) are arranged in the Y-direction for each of the first line L1 and the second line L2. Any one of the pressure chambers C communicates with the space RA via the supply flow path 322 and the intermediate flow path 326, and communicates with the nozzle N via the communication flow path 324.

On an outer surface of the diaphragm 36 on a side opposite to the pressure chambers C, the plurality of piezoelectric elements 37 corresponding to the different nozzles N are provided for each of the first line L1 and the second line L2 as illustrated in FIGS. 2 to 5. The piezoelectric elements 37 are pressure generating elements that deform due to supply of a drive signal and generate pressures in the pressure chambers C. Each of the plurality of piezoelectric elements 37 is arranged in the Y-direction so as to correspond to each of the pressure chambers C.

Each of the piezoelectric elements 37 is a stacked body of which a piezoelectric layer is sandwiched between a first electrode and a second electrode, which face each other. By applying a voltage to an area between the first electrode and the second electrode, a piezoelectric strain occurs in the piezoelectric layer sandwiched between the first electrode and the second electrode and thus the piezoelectric layer is displaced. Therefore, each of the piezoelectric elements 37 is a portion in which the first electrode, the second electrode, and the piezoelectric layer overlap each other. A pressure in each of the pressure chambers C changes by the diaphragm 36 vibrating in tandem with a piezoelectric strain of the piezoelectric layer 373. An adhesive layer for ensuring adhesion may be provided between the piezoelectric elements 37 and the diaphragm 36. That is, it is not necessary for the piezoelectric elements 37 to be directly provided on the outer surface of the diaphragm 36, and the piezoelectric elements may be provided on the outer surface of the diaphragm 36 via the adhesive layer. Zirconium, a zirconium oxide, titanium, a titanium oxide, and a silicon oxide can be used for the adhesive layer.

As illustrated in FIGS. 4 and 5, the diaphragm 36 is a plate-like member that can elastically vibrate. The diaphragm 36 of the embodiment is configured of an anisotropic single crystal silicon base of which a Young's modulus varies according to a direction in a crystal plane, and the outer surface of the diaphragm 36 is configured of a crystal plane of the single crystal silicon base. However, a crystal of the single crystal silicon base is not limited to being as the outer surface of the diaphragm 36, and may be included at least in the diaphragm 36. For example, in a case where the diaphragm 36 is formed by stacking a plurality of materials, the crystal of the single crystal silicon base may be included in the stacked materials. The diaphragm 36 is stacked and bonded to the side walls 344 (pressure chamber substrate 34) of the pressure chambers C and configures a wall surface (specifically, a top surface) intersecting the side walls 344 of the pressure chambers C. As described above, regions (regions configuring the top surfaces of the pressure chambers C) of the diaphragm 36, which overlap the pressure chambers C in plan view, are the vibration regions P that vibrate due to the piezoelectric elements 37.

Each of the piezoelectric elements 37 of the embodiment includes an inner peripheral portion 372a that overlaps the pressure chamber C in plan view (seen from the Z-direction) and an outer peripheral portion 372b that overlaps the side wall 344 of the pressure chamber C in plan view. The inner peripheral portions 372a are portions that are displaced in the Z-direction in tandem with piezoelectric strains of piezoelectric layers 373. The outer peripheral portions 372b are portions (portions that are not displaced in the Z-direction) of which displacement in the Z-direction is restrained by the side walls 344 of the pressure chambers C.

Each of the vibration regions P of the embodiment is a square having the same size as the pressure chamber C in plan view, and has an axis Gx that passes through the center O in the X-direction and an axis Gy that passes through the center O in the Y-direction. Since each of the vibration regions P of the embodiment is a square, the length of the vibration region P in a direction of the axis Gx is equal to the length of the vibration region in a direction of the axis Gy. In a case where each of the vibration regions P has a shape of which the length in the direction of the axis Gy and the length in direction of the axis Gx are different from each other, a short axis of the smallest rectangle which includes one of the vibration regions P will be set as the axis Gy of the vibration region P and a long axis of the smallest rectangle that includes the vibration region P will be set as the axis Gx of the vibration region P.

In the piezoelectric device 39 having such a configuration, displacement H in the Z-direction occurs in the vibration regions P of the diaphragm 36 due to piezoelectric strains of the piezoelectric elements 37 as illustrated with dotted lines of FIGS. 4 and 5. In this case, by aligning one side of the diaphragm 36 with a direction where a Young's modulus is low in a crystal plane, the diaphragm in the direction along the side of the diaphragm 36 can be made easier to deform in the Z-direction, for example, since a Young's modulus of a crystal plane of a silicon base changes according to a direction in the crystal plane. By doing so, it is considered that the displacement efficiency of the diaphragm 36 can be improved.

However, there is a possibility that the displacement of the diaphragm 36 in the Z-direction is inhibited as a whole since the diaphragm 36 is unlikely to be displaced in a crystal orientation of the diaphragm 36, in which a Young's modulus is high. For this reason, if a crystal orientation in which a Young's modulus is high is included in the diaphragm 36, the displacement of the entire diaphragm 36 in the Z-direction cannot be sufficiently improved in some cases simply by aligning a direction of the diaphragm 36 with a crystal orientation according to a value of the Young's modulus.

Figure 6:
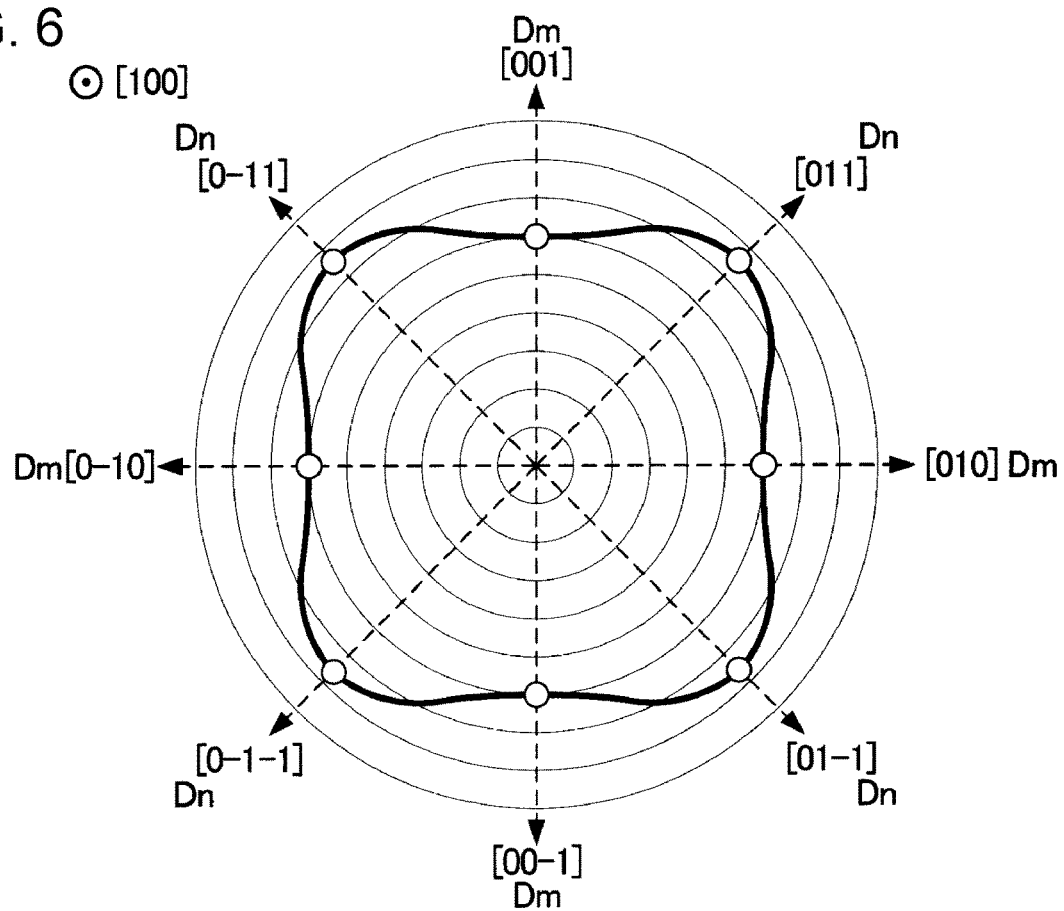
FIG. 6 is a graph showing an example of anisotropy of a Young's modulus of a single crystal silicon base in a (100) plane.

FIG. 6 is a graph showing an example of anisotropy of a Young's modulus in a (100) plane of a single crystal silicon base of which the crystal plane is the (100) plane (crystal plane orientation perpendicular to the crystal plane is [100]). FIG. 6 is expressed in polar coordinates, and the Young's modulus becomes higher as a distance from the center becomes longer. The Young's modulus in the (100) plane of the single crystal silicon base of which the crystal plane is the (100) plane has substantially square anisotropy. In FIG. 6, a Young's modulus is minimum in four crystal orientations [010], [001], [0-10], and [00-1]. When the orientations are set as Dm, a Young's modulus is maximum, for example, at orientations Dn having an angle of 45 degrees counter-clockwise from the orientations Dm. Therefore, even if the direction of the axis Gx of the vibration region P is aligned with the orientation Dm (for example, the crystal orientation [010]), for example, in order to make a Young's modulus lower to make the diaphragm 36 likely to be displaced, the diaphragm in the orientation Dn in which the Young's modulus is maximum is unlikely to be displaced in the Z-direction only by doing so. For this reason, the displacement of the diaphragm 36 in the Z-direction as a whole is inhibited and thus the displacement of the entire diaphragm 36 cannot be sufficiently improved.

In the first embodiment, in a case where a Young's modulus in a first direction (for example, the W direction) in a crystal plane is higher than a Young's modulus in a second direction (for example, the X-direction or the Y-direction) in the crystal plane, the widths of the piezoelectric elements 37 in the first direction is larger than the widths of the piezoelectric elements 37 in the second direction. According to this configuration, an area where the piezoelectric elements 37 are driven in a direction where a Young's modulus is high, which is a direction where the displacement H of the diaphragm 36 is likely to be obstructed, can be made wider than an area where the piezoelectric elements are driven in a direction where a Young's modulus is low.

For example, in a case where the shape of the pressure chamber C (the shape of the vibration region P) is a square as illustrated in FIG. 4, the shape of the inner edge (inner periphery) 37A of the piezoelectric element 37 is a square that is smaller than the pressure chamber C and the shape of the outer edge (outer periphery) 37B is a square that is larger than the pressure chamber C. Accordingly, the width of the piezoelectric element 37 in a direction where a Young's modulus is high can be made larger than the width of the piezoelectric element 37 in a direction where a Young's modulus is low.

Herein, a configuration of such a piezoelectric element 37 of FIGS. 4 and 5 will be described more specifically. In the crystal plane (100), a direction along a crystal orientation [011] in which a Young's modulus is maximum will be set as the first direction, and a direction along the crystal orientation [010] in which a Young's modulus is minimum will be set as the second direction. When a direction (axis along the W direction) where an angle of 45 degrees is formed counterclockwise from the axis Gx is set as Gw, the axis Gx of the vibration region P runs in the second direction and the axis Gw run in the first direction.

In the piezoelectric element 37 of FIG. 4, the shape of the inner edge 37A of the piezoelectric element 37 is a square smaller than the pressure chamber C and the shape of the outer edge 37B is a square larger than the pressure chamber C. Therefore, a width Tw (a upper right width or a lower left width in the plan view of FIG. 4) of the piezoelectric element 37 in the direction (first direction) of the axis Gw where a Young's modulus is maximum is larger than a width Tx (a left width or a right width in the plan view of FIG. 4) of the piezoelectric element 37 in the direction (second direction) of the axis Gx where a Young's modulus is minimum.

In the vibration region P of FIG. 4, directions of the axis Gw and an axis Gw', which are orthogonal to each other, correspond to the four orientations Dn of FIG. 6, in which a Young's modulus is maximum, and the directions of the axis Gx and the axis Gy of the vibration region P correspond to the four orientations Dm of FIG. 6, in which a Young's modulus is minimum. Therefore, the width Tw along the axis Gw is equal to a width Tw' along the axis Gw', and the width Tx along the axis Gx is equal to a width Ty along the axis Gy. The width Tw and the width Tw' are larger than the width Tx and the width Ty.

According to such a configuration, an area where the piezoelectric elements 37 are driven in a direction where a Young's modulus is high, which is a direction where the displacement of the diaphragm 36 is likely to be obstructed, can be made wider than an area where the piezoelectric elements are driven in a direction where a Young's modulus is low. Accordingly, since a deflection amount can be increased in an in-plane direction where a Young's modulus is high, the same amount as a deflection amount in an in-plane direction where a Young's modulus is low can be applied. Thus, an even strain can occur in the entire diaphragm 36. Therefore, as shown with a one dot chain line of FIG. 5, the displacement H greater than displacement H', which occurs in a case where the width of the piezoelectric element 37 in the direction along the axis Gw is made the same as the width Tx in the direction along the axis Gx, can occur. As described above, the entire diaphragm 36 is likely to be displaced, and thus the displacement efficiency of the diaphragm 36 can be improved.

Although a case where the crystal plane (100) of the single crystal silicon base is the outer surface (top surface) of the diaphragm 36 has been described in the embodiment, the configuration of the embodiment is applicable also to a case where a (010) plane or a (001) plane, which is a crystal plane equivalent to the crystal plane (100), is the outer surface (top surface) of the diaphragm 36 since single crystal silicon has a cubic crystal system. Even when the crystal plane is the (010) plane or the (001) plane, the Young's modulus is in a shape shown in FIG. 6. However, in a case where the crystal plane is the (010) plane, crystal orientations [−100], [−101], and [001] are applied by replacing the three reference crystal orientations [010], [011], and [001] in FIG. 6, respectively. In a case where the crystal plane is the (001) plane, crystal orientations [010], [−110], and [−100] are applied by replacing the crystal orientations [010], [011], and [001] in FIG. 6, respectively. As described above, all of the crystal planes (100), (010), and (001) are equivalent to each other, and a plane group of the crystal planes can be altogether referred to as a crystal plane {100}. In addition, since the crystal orientation [010] in the (100) plane, the crystal orientation [−100] in the (010) plane, and the crystal orientation [010] in the (001) plane are equal to each other, a direction group of the crystal orientation [010] and equivalents thereof can be altogether referred to as a crystal orientation <010>. Similarly, a direction group of the crystal orientation [011] and equivalents thereof can be altogether referred to as a crystal orientation <011>, and a direction group of the crystal orientation [010] and equivalents thereof can be altogether referred to as a crystal orientation <001>.

Figure 7:
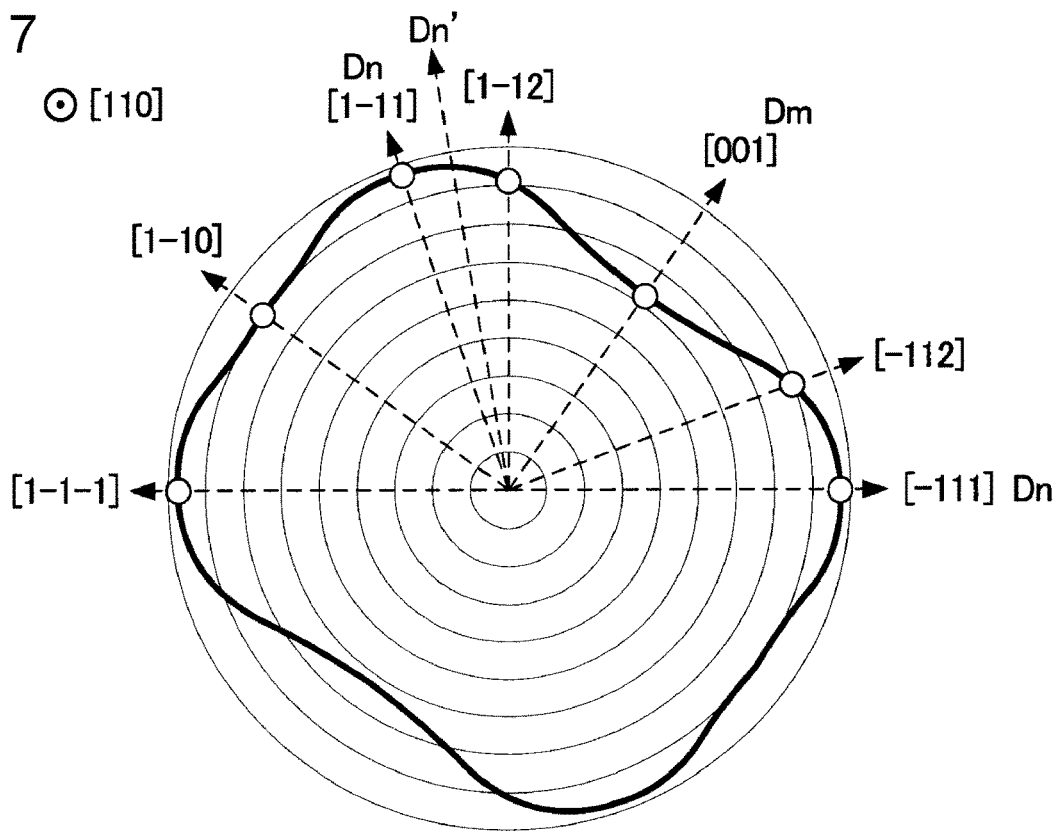
FIG. 7 is a graph showing an example of the anisotropy of the Young's modulus of the single crystal silicon base in a (110) plane.

The diaphragm 36 may be formed of a single crystal silicon base of which the crystal plane is a (110) plane (crystal plane orientation perpendicular to the crystal plane is [110]) as shown in FIG. 7. FIG. 7 is a graph showing an example of anisotropy of a Young's modulus in the (110) plane of the single crystal silicon base of which the crystal plane is the (110) plane. FIG. 7 is expressed in polar coordinates, and a Young's modulus becomes higher as a distance from the center becomes longer.

As shown in FIG. 7, the Young's modulus in the (110) plane of the single crystal silicon base has substantially rectangular anisotropy. In FIG. 7, in the (110) plane, for example, a Young's modulus is minimum in the crystal orientation [001], and for example, a Young's modulus is maximum in a crystal orientation [1-11] of 55 degrees counterclockwise from the crystal orientation [001]. Therefore, even if the direction of the axis Gx of the vibration region P is aligned with the crystal orientation in order to make a Young's modulus lower to make the diaphragm 36 likely to be displaced when an orientation in which a Young's modulus is minimum is set as Dm and an orientation in which a Young's modulus is maximum is set as Dn, the diaphragm in the orientation Dn in which the Young's modulus is maximum is unlikely to be displaced in the Z-direction only by doing so. For this reason, the displacement of the diaphragm 36 in the Z-direction as a whole is inhibited and thus the displacement of the entire diaphragm 36 cannot be sufficiently improved.

Also when the diaphragm 36 of FIG. 4 is configured of the single crystal silicon base of which the crystal plane is the (110) plane, the width of the piezoelectric element 37 in the first direction is larger than the width of the piezoelectric element 37 in the second direction in a case where a Young's modulus in the first direction in the crystal plane is higher than a Young's modulus in the second direction in the crystal plane. According to this configuration, an area where the piezoelectric elements 37 are driven in a direction where a Young's modulus is high, which is a direction where the displacement of the diaphragm 36 is likely to be obstructed, can be made wider than an area where the piezoelectric elements are driven in a direction where a Young's modulus is low. The first direction may not necessarily be a crystal orientation in which a Young's modulus is maximum, and the second direction may not necessarily be a crystal orientation in which a Young's modulus is minimum. For example, as shown in FIG. 7, in an orientation Dn' having an angle of 45 degrees with respect to Dm (for example, the crystal orientation [001]) in which a Young's modulus is minimum, a Young's modulus is not maximum but is higher than a minimum value. Therefore, even when the second direction is set to the orientation Dm in which a Young's modulus is minimum and the first direction is set to the orientation Dn', an area where the piezoelectric elements 37 are driven in a direction where a Young's modulus is high, which is a direction where the displacement of the diaphragm 36 is likely to be obstructed, can be made wider than an area where the piezoelectric elements are driven in a direction where a Young's modulus is low.

The axis Gw of the vibration region P illustrated in FIG. 4 runs in the first direction, and the axis Gx runs in the second direction. Therefore, when the direction of the axis Gx of the vibration region P illustrated in FIG. 4 is made so as to run in the orientation Dm (for example, the crystal orientation [001]), the axis Gw runs in the orientation Dn', in which a Young's modulus is higher than a Young's modulus in the orientation Dm, since the axis Gw has an angle of 45 degrees with respect to the axis Gx. Thus, by the piezoelectric elements 37 each having the shape illustrated in FIG. 4, the width Tw of the piezoelectric element 37 in the direction of the axis Gw where a Young's modulus is high can be made larger than the width Tx of the piezoelectric element 37 in the direction of the axis Gx where a Young's modulus is low. According to such a configuration, a deflection amount in the in-plane direction where a Young's modulus is high can be increased also in a case where the diaphragm 36 of FIG. 4 is configured of the single crystal silicon base of which the crystal plane is the (110) plane, the same amount as a deflection amount in the in-plane direction where a Young's modulus is low can be applied. Consequently, since an even strain can occur in the entire diaphragm 36, the entire diaphragm 36 is likely to be displaced and thus the displacement efficiency of the diaphragm 36 can be improved.

Herein, although a case where the crystal plane (110) of the single crystal silicon base is the outer surface (top surface) of the diaphragm 36 has been described in the embodiment, the configuration is applicable also to a case where a (011) plane or a (101) plane, which is a crystal plane equivalent to the crystal plane (110), is the outer surface (top surface) of the diaphragm 36 since single crystal silicon has a cubic crystal system. Even when the crystal plane is the (011) plane or the (101) plane, the Young's modulus is in a shape shown in FIG. 7. However, in a case where the crystal plane is the (011) plane, crystal orientations [1-11], [1-12], [100], [21-1], [11-1], [01-1], and [-11-1] are applied by replacing the seven reference crystal orientations [-111], [-112], [001], [1-12], [1-11], [1-10], and [1-1-1] in FIG. 7, respectively. In addition, in a case where the crystal plane is the (101) plane, crystal orientations [11-1], [12-1], [010], [-121], [-1-11], [-101], and [-1-11] are applied by replacing the seven reference crystal orientations [-111], [-112], [001], [1-12], [1-11], [1-10], and [1-1-1] in FIG. 7, respectively. As described above, all of the crystal planes (110), (011), and (101) are equivalent to each other, and a plane group of the crystal planes can be altogether referred to as a crystal plane {110}. In addition, since all of the crystal orientations [-111], [1-11], and [11-1] are equal to a crystal orientation [111], a direction group of the crystal orientations can be altogether referred to as a crystal orientation <111>. Similarly, a direction group of the crystal orientation [001] and equivalents thereof can be altogether referred to as <001>.

Although a case where each of the shape of the pressure chamber C, the shape of the inner edge 37A of the piezoelectric element 37, and the shape of the outer edge 37B of the piezoelectric element 37 is a square is given as an example in the embodiment, the shapes are not limited thereto. The shape of the pressure chamber C is a shape when the inner periphery 345 of the pressure chamber C is in plan view (seen from the Z-direction), and is the same as the shape of the vibration region P. The shape of the inner edge 37A of the piezoelectric element 37 is a shape when the inner edge 37A of the piezoelectric element 37 is in plan view (seen from the Z-direction), and the shape of the outer edge 37B of the piezoelectric element 37 is a shape when the outer edge 37B of the piezoelectric element 37 is in plan view (seen from the Z-direction).

Each of the shape of the pressure chamber C (the shape of the vibration region P), the shape of the inner edge 37A of the piezoelectric element 37, and the shape of the outer edge 37B of the piezoelectric element 37 may be other than a square such as a polygon or a circle. In addition to a rectangle, a diamond, a hexagon, and an octagon, the polygon also includes a rounded polygon such as a rounded square and a rounded rectangle. In addition to a perfect circle and an ellipse, the circle also includes a substantially circle (a semicircle and a sector). The shape of the pressure chamber C (the shape of the vibration region P), the shape of the inner edge 37A of the piezoelectric element 37, and the shape of the outer edge 37B of the piezoelectric element 37 may be different from each other. Even when the pressure chamber C and the piezoelectric element 37 are other than squares, the shape of the inner edge 37A of the piezoelectric element 37 and the shape of the outer edge 37B of the piezoelectric element 37 are determined in accordance with the shape of the pressure chamber C such that the width of the piezoelectric element 37 in the first direction is larger than the width of the piezoelectric element 37 in the second direction in a case where a Young's modulus in the first direction is higher than a Young's modulus in the second direction.

Figure 8:
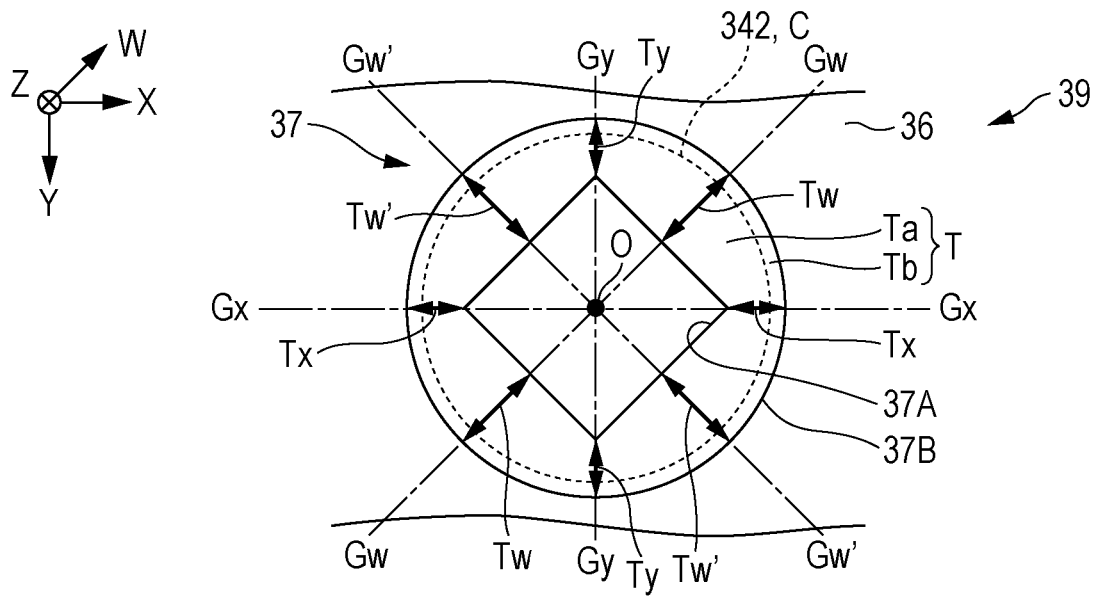
FIG. 8 is a plan view of a piezoelectric device according to a first modification example of the first embodiment.
Figure 9:
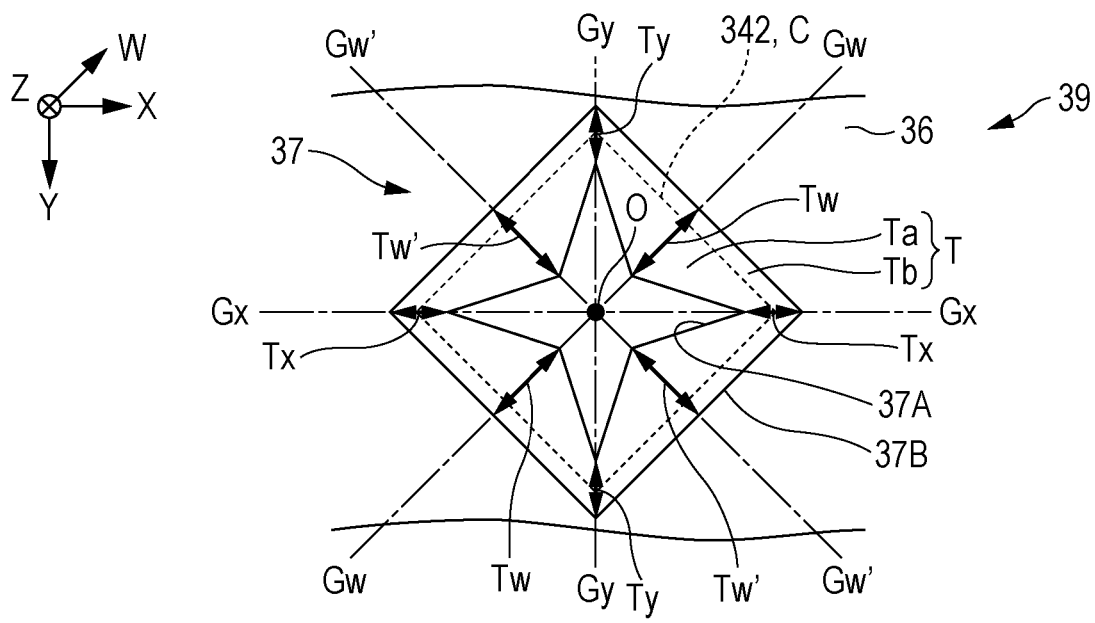
FIG. 9 is a plan view of a piezoelectric device according to a second modification example of the first embodiment.

For example, a first modification example of the first embodiment illustrated in FIG. 8 is a case where the shape of the pressure chamber C (the shape of the vibration region P) is a perfect circle. In this case, the shape of the inner edge 37A of the piezoelectric element 37 is a diamond, which is smaller than the pressure chamber C and is obtained by rotating a square 45 degrees, and the shape of the outer edge 37B of the piezoelectric element 37 is a perfect circle larger than the pressure chamber C. In addition, a second modification example of the first embodiment illustrated in FIG. 9 is a case where the shape of the pressure chamber C (the shape of the vibration region P) is a diamond, which is obtained by rotating the square of FIG. 4 45 degrees. In this case, the shape of the inner edge 37A of the piezoelectric element 37 is an octagon, which is smaller than the pressure chamber C, is projected in the directions of the axis Gx and the axis Gy, and is recessed in the directions of the axes Gw and Gw', and the shape of the outer edge 37B of the piezoelectric element 37 is a diamond larger than the pressure chamber C. By the piezoelectric element 37 having shapes illustrated in FIGS. 8 and 9 in accordance with the shape of the pressure chamber C (the shape of the vibration region P), the width of the piezoelectric element 37 in a direction where a Young's modulus is high can be made larger than the width of the piezoelectric element 37 in a direction where a Young's modulus is low.

Also in the configurations of FIGS. 8 and 9, when the direction of the axis Gx of the vibration region P is set as a direction where a Young's modulus is minimum, the direction of the axis Gw of the vibration region P is a direction where a Young's modulus is maximum, as in FIG. 4. In such piezoelectric elements 37 of FIGS. 8 and 9, the width Tw (an upper right width and a lower left width in the plan view of FIGS. 8 and 9) in the direction of the axis Gw where a Young's modulus is maximum is larger than the width Tx (right and left widths in the plan view of FIG. 8) of the piezoelectric element 37 in the direction of the axis Gx where a Young's modulus is minimum.

The vibration regions P and the piezoelectric elements 37 of FIGS. 8 and 9 also have the length in the direction of the axis Gx which is the same as the length in the direction of the axis Gy, are linearly symmetric with respect to the axis Gx, and are also linearly symmetric with respect to the axis Gy. Therefore, in the vibration region P, a Young's modulus is maximum also in the direction of the axis Gw' orthogonal to the axis Gw and a Young's modulus is minimum also in the direction of the axis Gy orthogonal to the axis Gx. Therefore, the width of the piezoelectric element 37 in any of the directions (first direction) of the axis Gw and the axis Gw' where a Young's modulus is maximum is larger than the width of the piezoelectric element 37 in any of the directions (second direction) of the axis Gx and the axis Gy where a Young's modulus is minimum. However, also in FIGS. 8 and 9, if a Young's modulus in the first direction is higher than a Young's modulus in the second direction, the first direction may not necessarily be a crystal orientation in which a Young's modulus is maximum, and the second direction may not necessarily be a crystal orientation in which a Young's modulus is minimum.

According to such a configuration, an area where the piezoelectric elements 37 are driven in a direction where a Young's modulus is high, which is a direction where the displacement of the diaphragm 36 is likely to be obstructed, can be made wider than an area where the piezoelectric elements are driven in a direction where a Young's modulus is low, also in FIGS. 8 and 9. Accordingly, since a deflection amount in an in-plane direction where a Young's modulus is high can be increased, the same amount as a deflection amount in the in-plane direction where a Young's modulus is low can be applied. Consequently, since an even strain can occur in the entire diaphragm 36, the displacement efficiency of the diaphragm 36 can be improved.

As described above, by changing the shapes of the inner edge 37A and the outer edge 37B of the piezoelectric element 37 according to the shape (the shape of the pressure chamber C seen from the Z-direction) of the vibration region P, a width T of the piezoelectric element 37 can be changed. The width T of the piezoelectric element 37 is a width between the inner edge 37A and the outer edge 37B, and includes the widths Tx, Ty, Tw, and Tw' in each direction. For example, as illustrated in FIG. 4, the width T of the piezoelectric element 37 can be divided into a width Ta of a portion that overlaps the pressure chamber C in plan view and a width Tb of a portion that overlaps the side wall 344 of the pressure chamber C in plan view. The width Ta of the piezoelectric element 37 is the width of the inner peripheral portion 372a, and the width Tb is the width of the outer peripheral portion 372b.

In a case where the widths Tx, Ty, Tw, and Tw' of the piezoelectric element 37 in each direction are changed, both of the width Ta and the width Tb of the piezoelectric element 37 may be changed according to the shapes of the inner edge 37A and the outer edge 37B of the piezoelectric element 37, or any one of the width Ta and the width Tb may be changed. The width Ta can be changed by changing the shape of the inner edge 37A of the piezoelectric element 37, and the width Tb can be changed by changing the shape of the outer edge 37B of the piezoelectric element 37.

In the configuration of FIG. 4, the width Tb of the piezoelectric element 37 is almost constant. According to the shape of the inner edge 37A of the piezoelectric element 37, the width Ta of the portion of the piezoelectric element 37 that overlaps the pressure chamber C in plan view, becomes larger in a direction where a Young's modulus is high in a crystal plane than in a direction where a Young's modulus is low in the crystal plane. However, the width Tb of the piezoelectric element 37 may not be constant. According to this configuration, since a deflection amount of the vibration region P of the diaphragm 36, which is displaced with the piezoelectric element 37, in the in-plane direction can be increased, the entire diaphragm 36 can be made likely to be displaced. As in the case of FIGS. 8 and 9, a case where the width Tb of the piezoelectric element 37 is made almost constant and the width Ta of the piezoelectric element 37 is changed is given as an example.

Figure 10:
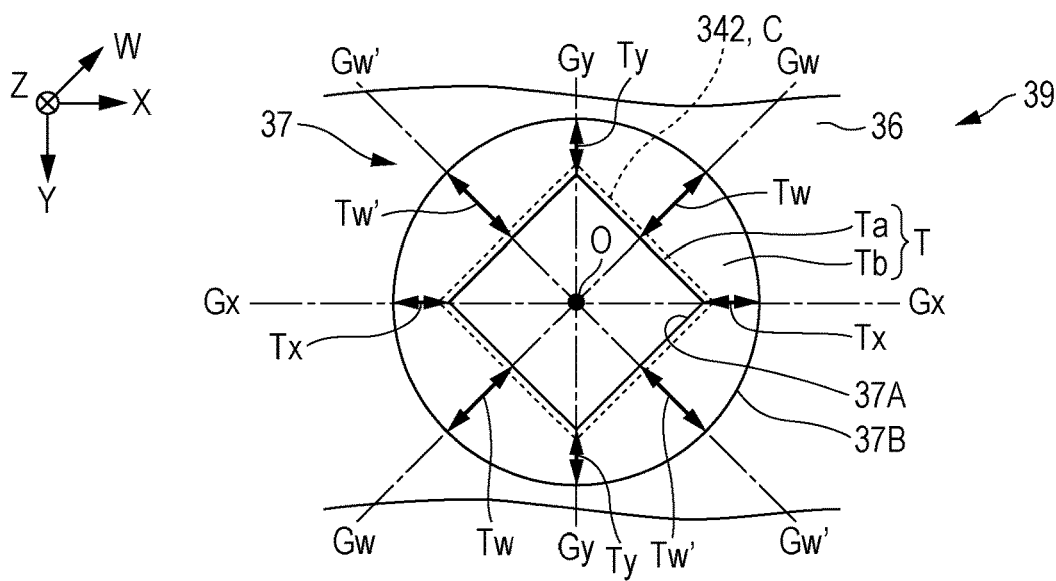
FIG. 10 is a plan view of a piezoelectric device according to a third modification example of the first embodiment.

On the other hand, according to the shape of the outer edge 37B of the piezoelectric element 37, the width Tb of the portion of the piezoelectric element 37 that overlaps the side wall 344 of the pressure chamber C in plan view can become larger in a direction where a Young's modulus is high in a crystal plane than in a direction where a Young's modulus is low in the crystal plane. For example, in a third modification example of the first embodiment illustrated in FIG. 10, the shape of the inner edge 37A of the piezoelectric element 37 is a diamond smaller than the pressure chamber C, and the outer edge 37B is a perfect circle larger than the pressure chamber C in a case where the shape of the pressure chamber C is the same diamond of FIG. 8. In the configuration of FIG. 10, the width Ta of the piezoelectric element 37 is almost constant. According to the shape of the outer edge 37B of the piezoelectric element 37, the width Tb of the portion of the piezoelectric element 37 that overlaps the side wall 344 of the pressure chamber C in plan view becomes larger in a direction where a Young's modulus is high in a crystal plane than in a direction where a Young's modulus is low in the crystal plane. However, the width Ta of the piezoelectric element 37 may not be constant. According to this configuration, since a deflection amount of the vibration region P of the diaphragm 36, which is close to the side wall 344 of the pressure chamber C, in the in-plane direction can be increased, the entire diaphragm can be made likely to be displaced.

Although a case where the direction of the axis Gx of the vibration region P lies in the orientation Dn in which a Young's modulus is maximum or the orientation Dn' near to the orientation Dn is given as an example in the embodiment, the direction is not limited thereto. For example, in a case where the diaphragm 36 is configured of the single crystal silicon base having the crystal plane of FIG. 6 or 7, the direction of the axis Gy of the vibration region P may be aligned with the orientation Dn in which a Young's modulus is maximum or an orientation in which a Young's modulus is higher than a Young's modulus in the direction of the axis Gw. Even in this way, the same effect as the embodiment can be obtained by forming the piezoelectric elements 37 so as to have the same shapes as in FIG. 4 and FIGS. 8 to 10.

Second Embodiment

A second embodiment of the invention will be described. In each form to be given as an example below, elements, of which operation and functions are the same as in the first embodiment, will be assigned with the same reference signs used in describing the first embodiment and detailed description of each of the elements will be omitted as appropriate. In the first embodiment, a case where the shape of the pressure chamber C (the shape of the vibration region P) of which the length in the direction of the axis Gx is the same as the length in the direction of the axis Gy is given as an example. In the second embodiment, a case where the shape of the pressure chamber C (the shape of the vibration region P) of which the length in the direction of the axis Gx is different from the length in the direction of the axis Gy will be given as an example.

Figure 11:
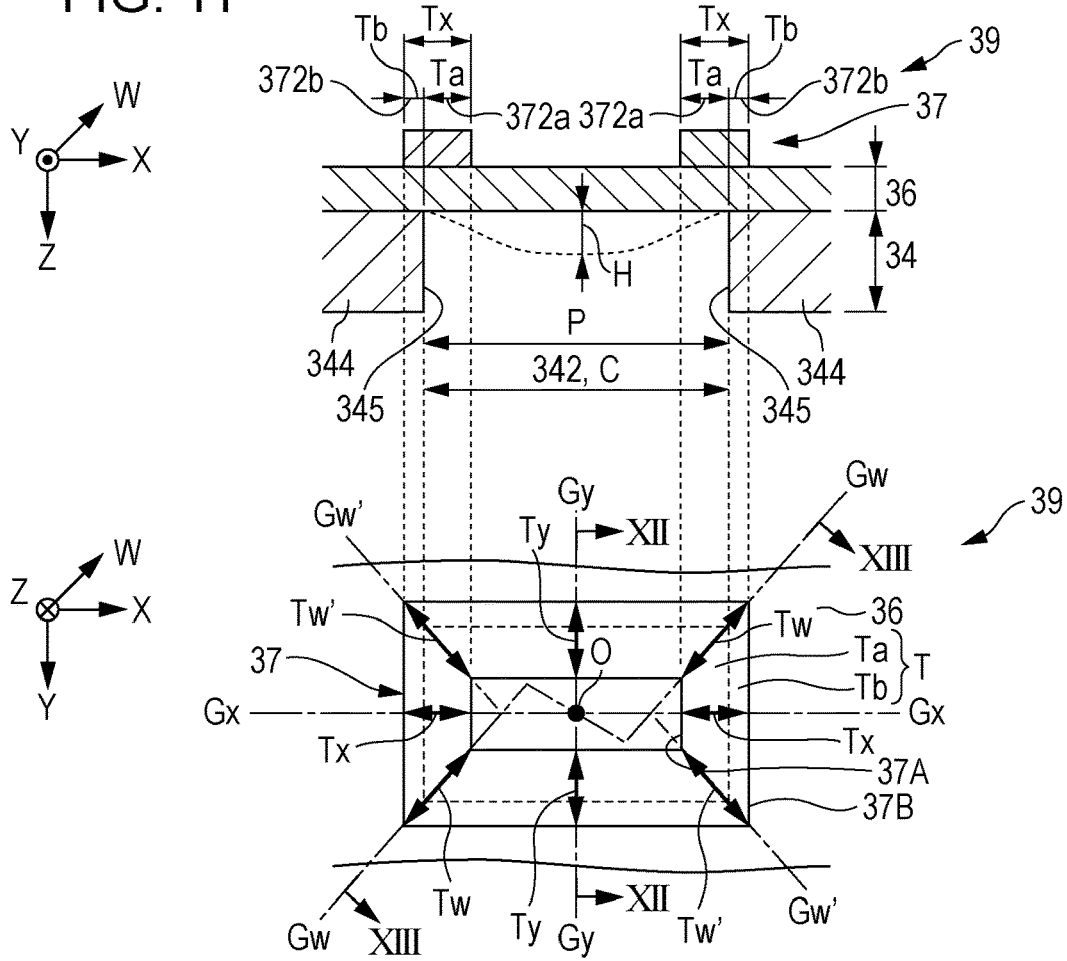
FIG. 11 is a sectional view and a plan view of a piezoelectric device according to a second embodiment.
Figure 12:
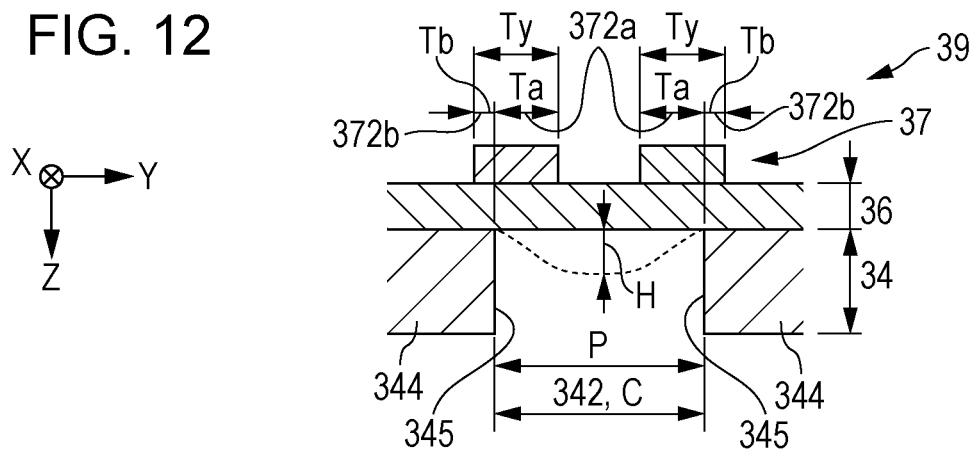
FIG. 12 is a sectional view of the piezoelectric device illustrated in FIG. 11 taken along line XII-XII.
Figure 13:
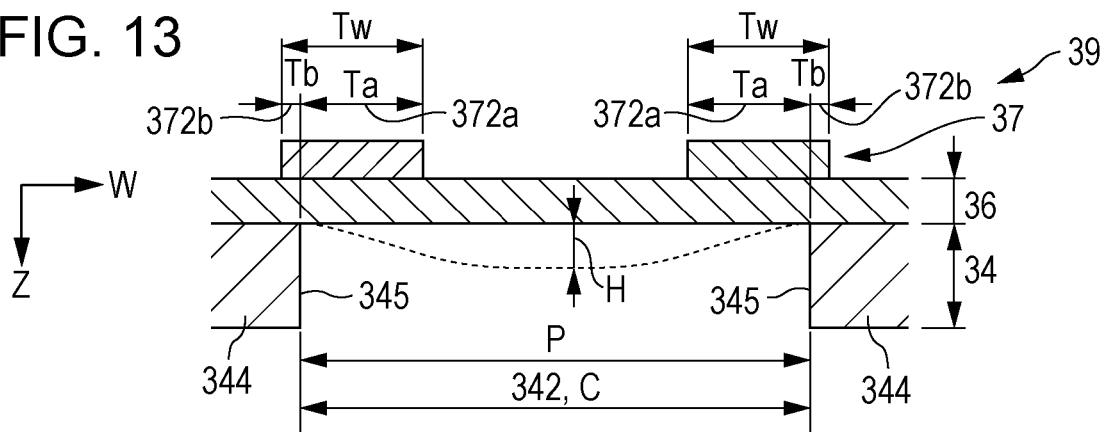
FIG. 13 is a sectional view of the piezoelectric device illustrated in FIG. 11 taken along line XIII-XIII.

FIG. 11 is a sectional view and a plan view of the enlarged piezoelectric device 39 of the second embodiment. The sectional view (view on the upper side of FIG. 11) of FIG. 11 is a view obtained by cutting the piezoelectric device 39 with the XZ-plane, and the plan view (view on the lower side of FIG. 11) of FIG. 11 is a view in which the piezoelectric device 39 is seen from the Z-direction. FIG. 12 is a sectional view of the piezoelectric device 39 illustrated in FIG. 11 taken along line XII-XII, and FIG. 13 is a sectional view of the piezoelectric device 39 illustrated in FIG. 11 taken along line XIII-XIII. The shape of the pressure chamber C (the shape of the vibration region P) is, in plan view, a rectangle formed of a long axis, which runs in the X-direction, and a short axis, which is shorter than the long axis and runs in the Y-direction. Hereinafter, the long axis, which runs in the X-direction, will be set as the axis Gx and the short axis, which runs in the Y-direction, will be set as the axis Gy. The shapes of the vibration regions P may be shapes other than a rectangle. In a case where each of the vibration regions P has a shape other than a rectangle, a short axis of the smallest rectangle that includes one of the vibration regions P is the axis Gy of the vibration region P and a long axis of the smallest rectangle that includes the vibration region P is the axis Gx of the vibration region P. A case where the shapes of the vibration regions P match the smallest rectangles that include the vibration regions has been described in the second embodiment.

In the piezoelectric device 39 having such a configuration, the displacement H in the Z-direction occurs in middle portions of the vibration regions P of the diaphragm 36 due to piezoelectric strains of the piezoelectric elements 37 as illustrated with dotted lines of FIGS. 11 to 13. In this case, even when the same displacement H occurs in the middle portions, the portions close to the side walls 344 in the Y-direction (direction of the axis Gy), which are illustrated in the sectional view of FIG. 12, are displaced so as to show curves steeper than the curves of the portions close to the side walls 344 in the X-direction (direction of the axis Gx), which are illustrated in the sectional view of FIG. 11. Therefore, the displacement of the entire diaphragm 36 is likely to be obstructed in the direction of the long axis Gx by the displacement in the direction of the short axis Gy, and if a deflection amount in the direction of the short axis Gy can be increased, an even strain can occur in the entire diaphragm 36.

In the second embodiment, the width Ty of the piezoelectric element 37 in the direction of the short axis Gy of the smallest rectangle that includes the vibration region P is larger than the width Tx of the pressure chamber C in the direction of the long axis Gx of the rectangle. According to this configuration, an area where the piezoelectric elements 37 are driven in the direction of the short axis Gy where displacement of the diaphragm 36 is likely to be obstructed can be made wider than an area where the piezoelectric elements are driven in the direction of the long axis Gx.

For example, in a case where the shape of the pressure chamber C (the shape of the vibration region P) is a rectangle as illustrated in FIG. 11, the shape of the inner edge 37A of the piezoelectric element 37 is a rectangle smaller than the pressure chamber C and the shape of the outer edge 37B is a rectangle larger than the pressure chamber C. At this time, the width Ty in the direction of the axis Gy is made larger than the width Tx in the direction of the axis Gx. According to this configuration, an area where the piezoelectric elements 37 are driven in the direction of the short axis Gy where the displacement H of the diaphragm 36 is likely to be obstructed can be made wider than an area where the piezoelectric elements are driven in the direction of the long axis Gx. Accordingly, since a deflection amount can be increased in the direction of the short axis Gy, the same amount as a deflection amount in the direction of the long axis Gx can be applied. Consequently, since a deflection amount of the diaphragm 36 in the in-plane direction can be increased, an even strain can occur in the entire diaphragm 36. Therefore, the entire diaphragm 36 is likely to be displaced, and thus the displacement efficiency of the diaphragm 36 can be improved.

Also in the second embodiment, in a case where a Young's modulus in the first direction in a crystal plane is higher than a Young's modulus in the second direction in the crystal plane, the width of the piezoelectric element 37 in the first direction is larger than the width of the piezoelectric element 37 in the second direction, as in the first embodiment. For example, also in the configuration of FIG. 11, the diaphragm 36 is configured of the single crystal silicon base having the crystal plane of FIG. 6 or 7, and the orientation Dn in which a Young's modulus is high or a direction along the orientation Dn' can be set as the first direction and a direction along the orientation Dm in which a Young's modulus is minimum can be set as the second direction. When a direction (axis along the W direction) where an angle of 45 degrees is formed counterclockwise from the axis Gx is set as Gw, the axis Gw of the vibration region P runs in the first direction and the axis Gy runs in the second direction. According to the piezoelectric element 37 of FIG. 11, the width Tw (an upper right width or a lower left width in the plan view of FIG. 11) of the piezoelectric element 37 in the direction (first direction) of the axis Gw where a Young's modulus is high is larger than the width Ty (an upper width or a lower width in the plan view of FIG. 11) of the piezoelectric element 37 in the direction (second direction) of the axis Gy where a Young's modulus is minimum. In the vibration region P of FIG. 11, the width Tw' (an upper left width and a lower right width in the plan view of FIG. 11) in the direction of the axis Gw' is larger than the width Ty (an upper width or a lower width in the plan view of FIG. 11) of the piezoelectric element 37 in the direction of the axis Gy where a Young's modulus is minimum since a Young's modulus is also higher in the direction of the axis Gw' than in the direction of the axis Gy.

According to such a configuration, an area where the piezoelectric elements are driven in a direction where a Young's modulus is high, which is a direction where the displacement of the diaphragm 36 is likely to be obstructed, can be made wider. As described above, a deflection amount of the diaphragm 36 in the in-plane direction can be increased also in a direction where a Young's modulus is high. Therefore, an effect of improving the displacement efficiency of the diaphragm 36 can be enhanced in the vibration region P of which the length in the direction of the axis Gx and the length in the direction of the axis Gy are different from each other.

When the width Tw of the piezoelectric element 37 in a direction (first direction) along the axis Gw where a Young's modulus is high is set as a first width and the width Ty in a direction (second direction) along the axis Gy where a Young's modulus is low is set as a second width, the first width and the second width are larger than the width Tx of the piezoelectric element 37 in the direction of the long axis Gx. According to this configuration, the displacement efficiency of the entire diaphragm 36 can be improved since the width of each of the piezoelectric elements 37 can be made larger with priority given to a direction of the Young's modulus rather than an axial direction of the vibration region P.

Although a case where the shape (the shape of the vibration region P) of the pressure chamber C, the shape of the inner edge 37A of the piezoelectric element 37, and the shape of the outer edge 37B of the piezoelectric element 37 is a rectangle of which the length in the direction of the axis Gx and the length in the direction of the axis Gy are different from each other is given as an example in the second embodiment, the shapes are not limited thereto. The shapes may be other than a rectangle such as a polygon and a circle insofar as the shapes are a shape of which the length in the direction of the axis Gx and the length in the direction of the axis Gy are different from each other. In addition to a diamond, a hexagon, and an octagon, the polygon also includes a rounded polygon such as a rounded square and a rounded rectangle. In addition to an ellipse, the circle also includes a substantially circle (a semicircle and a sector). The shape of the pressure chamber C (the shape of the vibration region P), the shape of the inner edge 37A of the piezoelectric element 37, and the shape of the outer edge 37B of the piezoelectric element 37 may be different from each other. In a case where the shapes are other than a rectangle, the shape of the inner edge 37A of the piezoelectric element 37 and the shape of the outer edge 37B of the piezoelectric element 37 are determined according to the shape of the pressure chamber C such that the width Ty of the piezoelectric element 37 in the direction of the short axis Gy of the smallest rectangle that includes the vibration region P is larger than the width Tx of the pressure chamber C in the direction of the long axis Gx of the rectangle.

Figure 14:
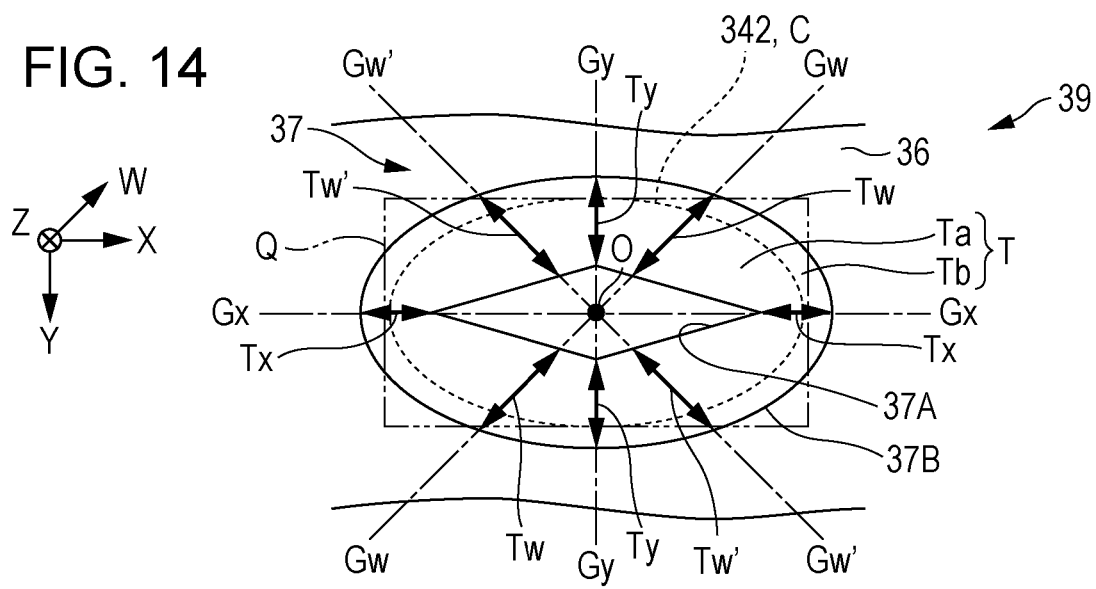
FIG. 14 is a plan view of a piezoelectric device according to a first modification example of the second embodiment.

For example, in a first modification example of the second embodiment illustrated in FIG. 14, since the vibration region P is an ellipse, a short axis (short axis of the ellipse) of the smallest rectangle Q including the vibration region P shown with two dot chain line in FIG. 14 is the axis Gy of the vibration region P and a long axis (long axis of the ellipse) of the rectangle Q including the vibration region P is the axis Gx of the vibration region P. Regarding the shape of such a pressure chamber C, the shape of the inner edge 37A of the piezoelectric element 37 of FIG. 14 is a diamond, which is smaller than the pressure chamber C and of which an axis along the axis Gx is longer than an axis along the axis Gy, and the shape of the outer edge 37B of the piezoelectric element 37 is the same ellipse as the pressure chamber C, which is larger than the pressure chamber C.

Also in the configuration of FIG. 14, the diaphragm 36 is configured of the single crystal silicon base having the crystal plane of FIG. 6 or 7, and the orientation Dn in which a Young's modulus is high or a direction along the orientation Dn' can be set as the first direction and a direction along the orientation Dm in which a Young's modulus is minimum can be set as the second direction. When a direction (axis along the W direction) where an angle of 45 degrees is formed counterclockwise from the axis Gx is set as Gw, the axis Gw of the vibration region P runs in the first direction and the axis Gy runs in the second direction. According to the piezoelectric element 37 of FIG. 14, the width Tw (an upper right width or a lower left width in the plan view of FIG. 14) of the piezoelectric element 37 in the direction (first direction) of the axis Gw where a Young's modulus is high is larger than the width Ty (an upper width or a lower width in the plan view of FIG. 14) of the piezoelectric element 37 in the direction (second direction) of the axis Gy where a Young's modulus is minimum. In the vibration region P of FIG. 14, the width Tw' (an upper left width and a lower right width in the plan view of FIG. 14) in the direction of the axis Gw' is larger than the width Ty (an upper width or a lower width in the plan view of FIG. 14) of the piezoelectric element 37 in the direction of the axis Gy where a Young's modulus is minimum since a Young's modulus is also higher in the direction of the axis Gw' than in the direction of the axis Gy.

According to such a configuration, an area where the piezoelectric elements 37 are driven in a direction where a Young's modulus is high, which is a direction where the displacement of the diaphragm 36 is likely to be obstructed, can be made wider. As described above, a deflection amount of the diaphragm 36 in the in-plane direction can be increased also from a perspective of a Young's modulus. Therefore, an effect of improving the displacement efficiency of the diaphragm 36 can be enhanced in the vibration region P of which the length in the direction of the axis Gx and the length in the direction of the axis Gy are different from each other.

When the width Tw of the piezoelectric element 37 in the direction (first direction) along the axis Gw where a Young's modulus is high is set as the first width and the width Ty in the direction (second direction) along the axis Gy where a Young's modulus is low is set as the second width, the first width and the second width are larger than the width Tx of the piezoelectric element 37 in the direction of the long axis Gx. According to this configuration, the displacement efficiency of the entire diaphragm 36 can be improved since the width of each of the piezoelectric elements 37 can be made larger with priority given to a direction of the Young's modulus rather than an axial direction of the vibration region P.

Also in the second embodiment, by changing the shapes of the inner edge 37A and the outer edge 37B of the piezoelectric element 37 according to the shape (the shape of the pressure chamber C seen from the Z-direction) of the vibration region P, the width T of the piezoelectric element 37 can be changed. In a case where the widths Tx, Ty, Tw, and Tw' of the piezoelectric element 37 in each direction are changed, both of the width Ta and the width Tb of the piezoelectric element 37 may be changed according to the shapes of the inner edge 37A and the outer edge 37B of the piezoelectric element 37, or any one of the width Ta and the width Tb may be changed. The width Ta can be changed by changing the shape of the inner edge 37A of the piezoelectric element 37, and the width Tb can be changed by changing the shape of the outer edge 37B of the piezoelectric element 37.

In the configuration of FIGS. 11 and 14, the width Tb of the piezoelectric element 37 is made almost constant. The width of the portion of the piezoelectric element 37 that overlaps the pressure chamber C in plan view becomes larger in a direction where a Young's modulus is high in a crystal plane than in a direction where a Young's modulus is low in the crystal plane by changing the width Ta of the piezoelectric element 37. The width Ta of the piezoelectric element 37 may be almost constant and the width Tb of the piezoelectric element 37 may be changed.

However, although a case where the outer surface of the diaphragm 36 is configured of an anisotropic single crystal silicon base of which a Young's modulus varies according to a direction in a crystal plane is given as an example in the description made hereinbefore, the outer surface is not limited thereto. The outer surface of the diaphragm 36 may be configured of a crystal plane {111} of an isotropic single crystal silicon base, of which a Young's modulus is the same regardless of a direction in the crystal plane, and the width Ty of the piezoelectric element 37 in the direction of the short axis Gy of the smallest rectangle that includes the vibration region P may be made larger than the width Tx of the pressure chamber C in the direction of the long axis Gx of the rectangle.

Figure 15:
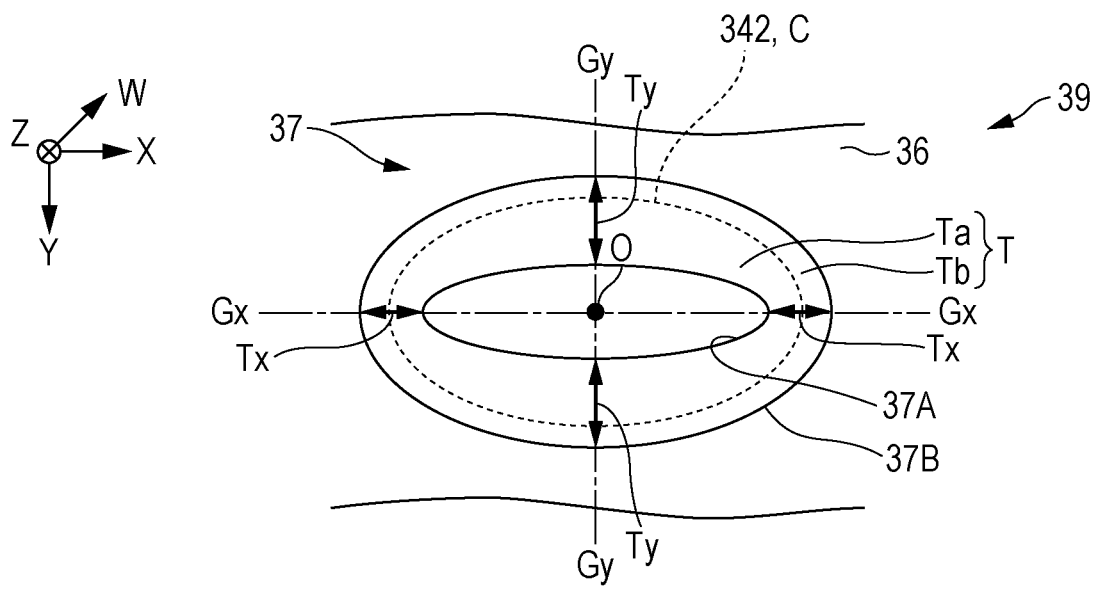
FIG. 15 is a plan view of a piezoelectric device according to a second modification example of the second embodiment.

For example, a second modification example of the second embodiment illustrated in FIG. 15 is a case where the shape of the pressure chamber C (the shape of the vibration region P) is an ellipse of which the axis Gx is longer than the axis Gy, as in FIG. 14. In the piezoelectric element 37 of FIG. 15, the shape of the outer edge 37B is the same ellipse as in FIG. 14, but the shape of the inner edge 37A is an ellipse of which an axis along the axis Gx is longer than an axis along the axis Gy unlike in FIG. 14. That is because, in FIG. 14, it is sufficient to determine the width Tx and the width Ty of the piezoelectric element 37 based on the axis Gx and the axis Gy since a Young's modulus does not change according to a direction in the crystal plane.

Figure 16:
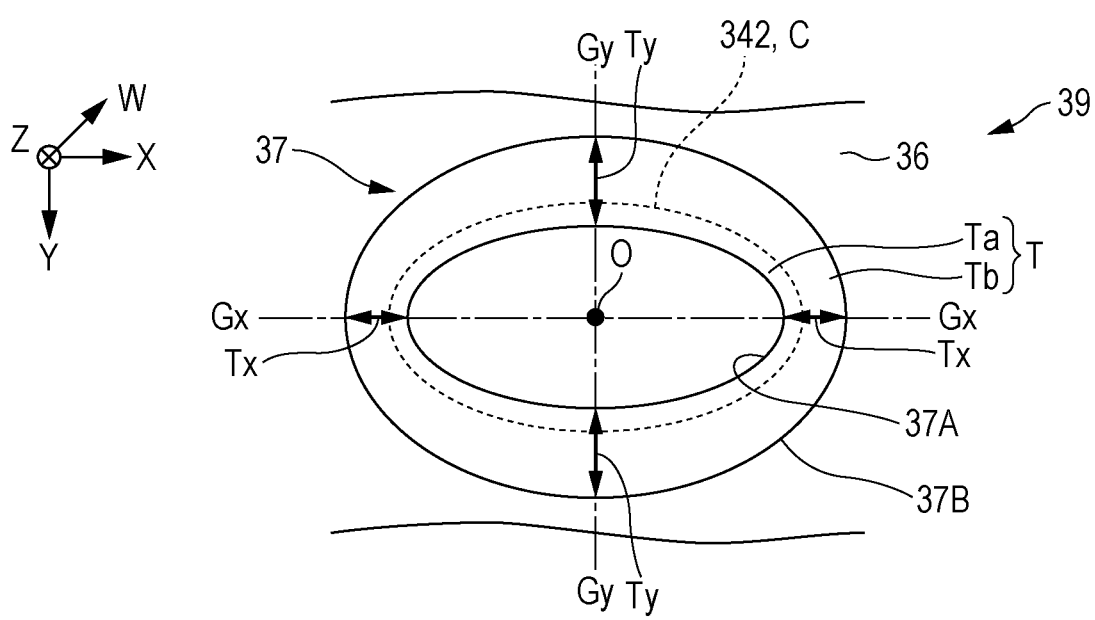
FIG. 16 is a plan view of a piezoelectric device according to a third modification example of the second embodiment.

Also in the case of FIG. 15, both of the width Ta and the width Tb of the piezoelectric element 37 may be changed according to the shapes of the inner edge 37A and the outer edge 37B of the piezoelectric element 37, or any one of the width Ta and the width Tb may be changed. In FIG. 15, a case where the width Tb of the piezoelectric element 37 is made almost constant and the width Ta of the piezoelectric element 37 is changed is given as an example. As in a third modification example of the second embodiment illustrated in FIG. 16, the width Ta of the piezoelectric element 37 may be made almost constant and the width Tb of the piezoelectric element 37 may be changed. The shape of the pressure chamber C of FIG. 16 is the same ellipse as in FIG. 15.

Third Embodiment

Figure 17:
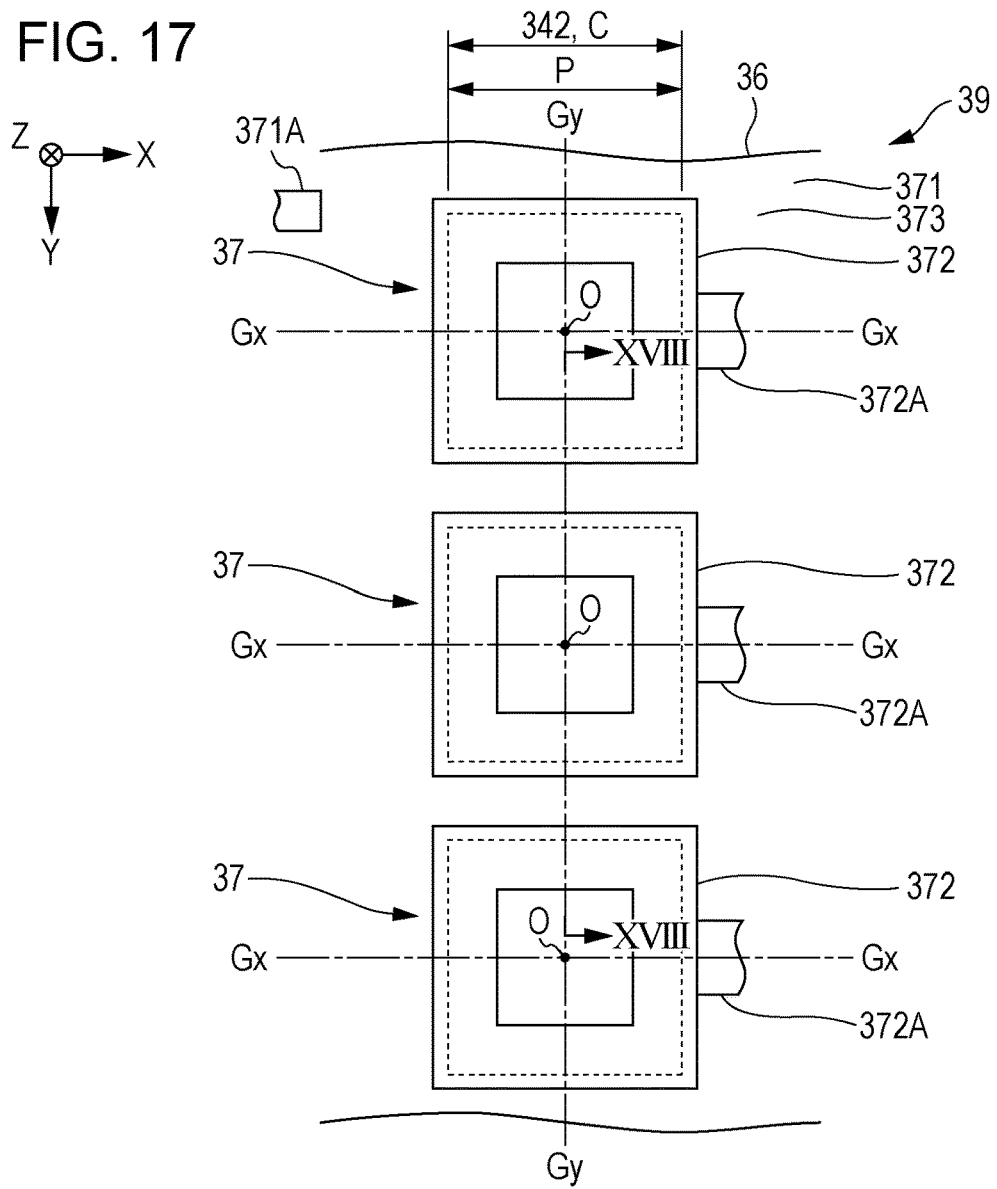
FIG. 17 is a plan view of a piezoelectric device according to a third embodiment.
Figure 18:
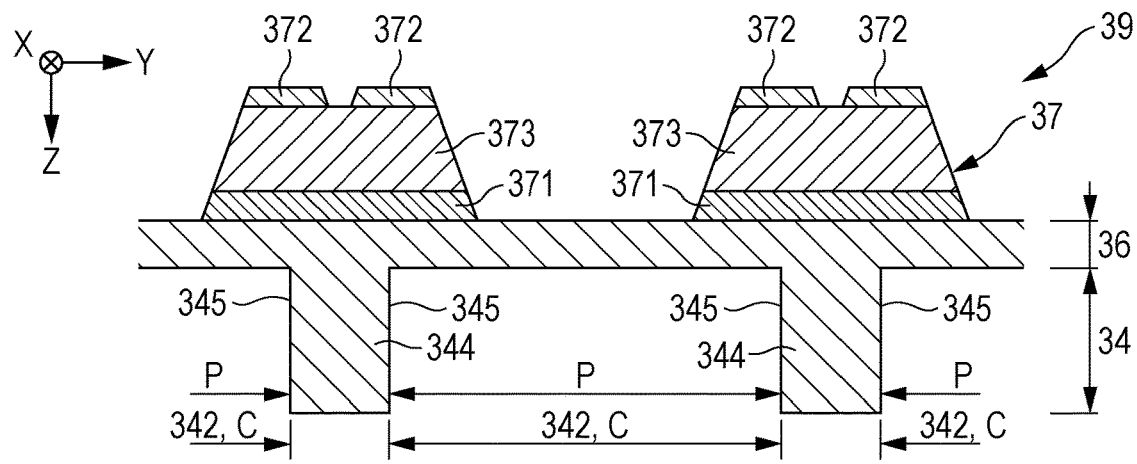
FIG. 18 is a sectional view of the piezoelectric device illustrated in FIG. 17 taken along line XVIII-XVIII.

A third embodiment of the invention will be described. A specific configuration example of the piezoelectric elements 37 of the piezoelectric device 39 according to the first embodiment will be described in the third embodiment. FIGS. 17 and 18 are specific configuration examples of the piezoelectric element 37 of FIG. 4. FIG. 17 is a plan view of a case where the piezoelectric device 39 according to the third embodiment is seen from the Z-direction. FIG. 18 is a sectional view of the piezoelectric device 39 illustrated in FIG. 17 taken along line XVIII-XVIII.

As illustrated in FIGS. 17 and 18, the piezoelectric element 37 of the third embodiment is disposed on the diaphragm 36 so as to overlap the inner periphery 345 of the pressure chamber C without overlapping a center O of the pressure chamber C in plan view. The piezoelectric element has the inner edge 37A on a center O side of the pressure chamber C and has the outer edge 37B on a side wall 344 side of the pressure chamber C with the inner periphery 345 of the pressure chamber C being sandwiched between the outer edge and the inner edge in plan view. According to such a configuration, the width of the piezoelectric element 37 can be changed according to the shape of the inner edge 37A and the shape of the outer edge 37B of the pressure chamber C. It is easy to change the width of the piezoelectric element 37 according to a direction since the piezoelectric element 37 is disposed around the center O of the pressure chamber C. Since the entire perimeter of the piezoelectric element 37 overlaps the entire perimeter of the inner periphery 345 of the pressure chamber C in plan view, an even strain is likely to occur in the entire diaphragm 36 by changing the width of the piezoelectric element 37 according to a direction. Accordingly, the entire diaphragm 36 is likely to be displaced, and thus the displacement efficiency of the diaphragm 36 can be improved.

Each of the piezoelectric elements 37 of FIG. 17 is a stacked body of which a piezoelectric layer 373 is sandwiched between a first electrode 371 and a second electrode 372, which face each other. By applying a voltage between the first electrode 371 and the second electrode 372, a piezoelectric strain occurs in the piezoelectric layer 373 sandwiched between the first electrode 371 and the second electrode 372 and the piezoelectric element 37 is displaced. Therefore, in the configuration of FIG. 17, a portion where the first electrode 371, the second electrode 372, and the piezoelectric layer 373 overlap each other in plan view corresponds to each of the piezoelectric elements 37.

The first electrode 371 and the piezoelectric layer 373 illustrated in FIG. 17 are formed on the outer surface of the diaphragm 36 so as to overlap the entire perimeter of each of the inner peripheries 345 of the pressure chambers C in plan view in each of portions of the pressure chambers C. The first electrodes 371 and the piezoelectric layers 373 are not formed on the centers O of the pressure chambers C. The first electrode 371 and the piezoelectric layer 373 are formed on the entire outer surface of the diaphragm 36 except for each of the portions of the pressure chambers C. However, the first electrode 371 and the piezoelectric layer 373 may not be formed except for each of the portion of the pressure chambers C. The shapes of inner peripheries of the first electrode 371 and the piezoelectric layer 373 are squares in plan view.

Each of the first electrodes 371 is connected to the drive IC 62 via each of lead electrodes 371A pulled out to the outside of each of the piezoelectric layers 373. Each of the first electrodes 371 is a common electrode for the plurality of piezoelectric elements 37. A material that does not oxidize when forming the piezoelectric layers 373 and can maintain conductivity is preferable as a material of the first electrodes 371. For example, precious metals such as platinum (Pt) and iridium (Ir), or conductive oxides represented by lanthanum nickel oxides (LNO) are suitably used.

The piezoelectric layers 373 are made of, for example, a ferroelectric ceramic material showing electromechanical conversion action, such as a crystal film (perovskite type crystal) having a perovskite structure. The material of the piezoelectric layers 373 is not limited to the material described above. For example, in addition to a ferroelectric piezoelectric material, such as lead zirconate titanate (PZT), and a ferroelectric piezoelectric material to which a metal oxide, such as a niobium oxide, a nickel oxide, and a magnesium oxide, is added, non-lead-based piezoelectric materials that do not include lead can be used without being limited to lead-based piezoelectric materials that include lead.

The second electrode 372 is separately stacked on the first electrode 371 on a side opposite to the diaphragm 36 for each of the piezoelectric elements 37 (for each of the nozzles N) and configures a separate electrode corresponding to each of the plurality of piezoelectric elements 37. Each of the second electrodes 372 is separately connected to the drive IC 62 via each of lead electrodes 372A pulled out to the outside of each of the piezoelectric layers 373. Each of the second electrodes 372 may be directly provided on each of the piezoelectric layers 373, or other members may be sandwiched between the piezoelectric layers 373 and the second electrodes 372. A material that can form an interface between the piezoelectric layer 373 and the material well and can demonstrate insulation properties and piezoelectric properties is desirable for the second electrodes 372. For example, a precious metal material, such as iridium (Ir), platinum (Pt), palladium (Pd), and gold (Au), or conductive oxides represented by lanthanum nickel oxides (LNO) is suitably used. The second electrodes 372 may be formed by stacking a plurality of materials.

The second electrode 372 is disposed so as to overlap the entire perimeter of each of the inner peripheries 345 of the pressure chambers C in plan view. In plan view, the shapes of the inner periphery and the outer periphery of each second electrode 372 are squares. In the configuration of the embodiment, a portion from the inner periphery to the outer periphery of the second electrode 372 overlaps the first electrode 371 and the piezoelectric layer 373. Therefore, the shape of the inner periphery of the second electrode 372 corresponds to the shape of the inner edge 37A of the piezoelectric element 37, and the shape of the outer periphery of the second electrode 372 corresponds to the shape of the inner edge 37A of the piezoelectric element 37. The diaphragm 36 of the third embodiment is the same single crystal silicon base as in the first embodiment and the second embodiment, and is configured so as to be integrated with the pressure chamber substrate 34.

A case where in the piezoelectric elements 37 of the embodiment, the first electrodes 371 are set as common electrodes for the plurality of piezoelectric elements 37 and the second electrodes 372 are set as separate electrodes corresponding to the plurality of piezoelectric elements 37 is given as an example. Without being limited to the configuration, however, the second electrodes 372 may be set as common electrodes for the plurality of piezoelectric elements 37 and the first electrodes 371 may be set as separate electrodes corresponding to the plurality of piezoelectric elements 37. Although a case where the diaphragm 36 is configured of a single layer is given as an example in the embodiment described above, the diaphragm may be configured of a plurality of layers without being limited thereto.

According to the piezoelectric device 39 of the third embodiment having such a configuration, a piezoelectric strain and displacement occurs in each piezoelectric layer 373 sandwiched between the first electrode 371 and the second electrode 372 by applying a voltage to an area between the first electrode 371 and the second electrode 372. A pressure in each of the pressure chambers C changes by the diaphragm 36 vibrating in tandem with a piezoelectric strain of the piezoelectric layer 373. Portions of the diaphragm 36, which overlap the pressure chambers C, are the vibration regions P. The diaphragm 36 of FIG. 17 is configured of the single crystal silicon substrate having the crystal plane of FIG. 6 or 7. In the piezoelectric elements 37 of FIG. 17, the width of each piezoelectric element 37 in the first direction is larger than the width of each piezoelectric element 37 in the second direction in a case where a Young's modulus in the first direction (for example, the W direction) is higher than a Young's modulus in the second direction (for example, the X-direction or the Y-direction) in the crystal plane, as in the configuration of FIG. 4. Although illustration is omitted in FIG. 17, each of the widths Tx, Ty, Tw, and Tw' of the piezoelectric element 37 in each direction of the axis Gx, the axis Gy, the axis Gw, and the axis Gw' is the same as the configuration of FIG. 4. Due to such a configuration, a deflection amount of the diaphragm 36 in the in-plane direction can be increased in a direction where a Young's modulus is high, which is a direction where displacement of the diaphragm 36 is likely to be obstructed. Thus, the displacement efficiency of the diaphragm 36 can be improved. Also in other embodiments and modification examples described above, each of the piezoelectric elements can be configured of the first electrode 371, the second electrode 372, and the piezoelectric layer 373 as in the third embodiment.

Fourth Embodiment

Figure 19:
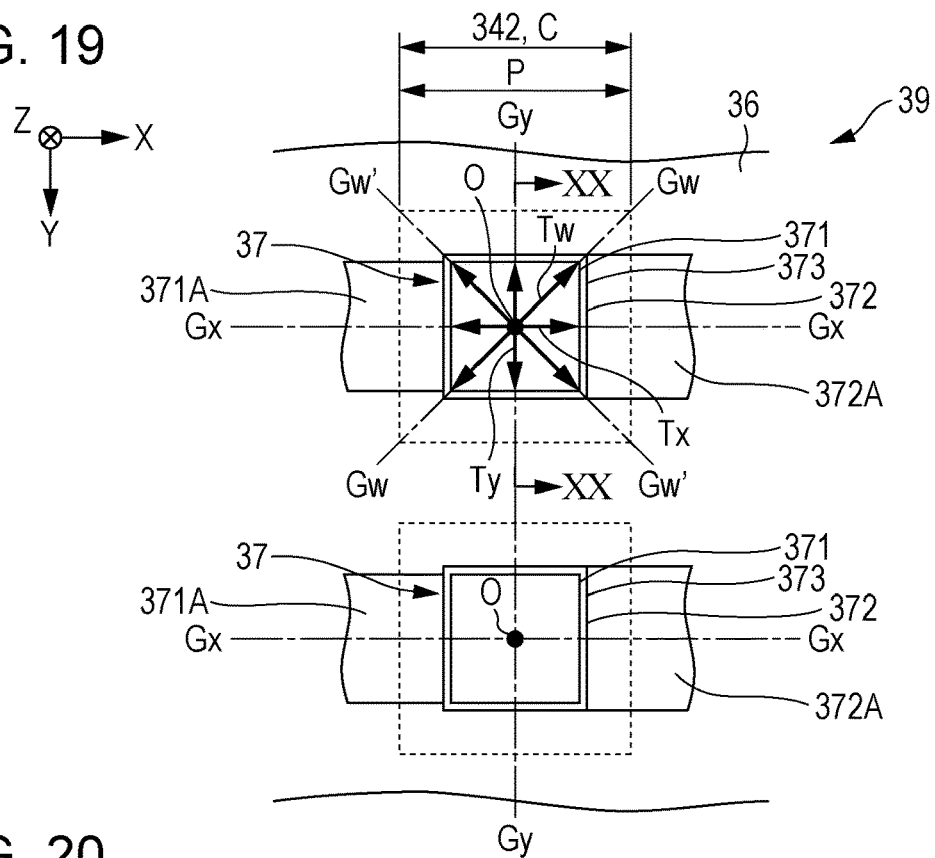
FIG. 19 is a plan view of a piezoelectric device according to a fourth embodiment.
Figure 20:
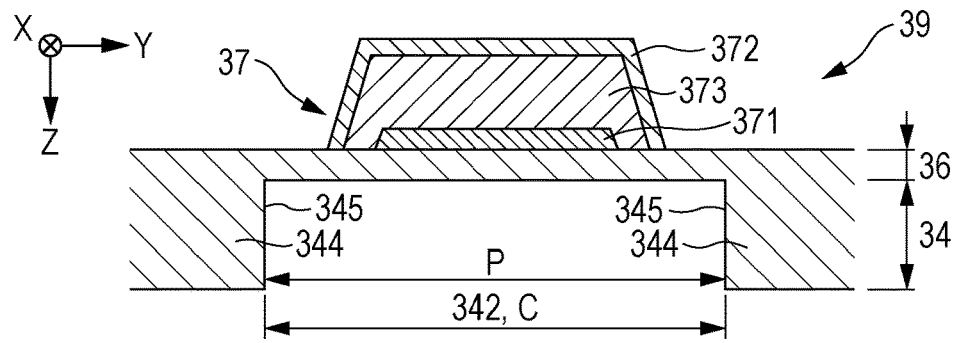
FIG. 20 is a sectional view of the piezoelectric device illustrated in FIG. 19 taken along line XX-XX.

A fourth embodiment of the invention will be described. Although a case where the piezoelectric elements 37 are disposed in peripheral portions of the pressure chambers C is given as an example in embodiment described above, a case where the piezoelectric elements 37 are disposed in center portions of the pressure chambers C is given as an example in the fourth embodiment. FIG. 19 is a plan view of a case where the piezoelectric device 39 according to the fourth embodiment is seen from the Z-direction. FIG. 20 is a sectional view of the piezoelectric device 39 illustrated in FIG. 19 taken along line XX-XX.

As illustrated in FIGS. 19 and 20, each of the piezoelectric elements 37 of the fourth embodiment is a stacked body of which the piezoelectric layer 373 is sandwiched between the first electrode 371 and the second electrode 372, which face each other. By applying a voltage to an area between the first electrode 371 and the second electrode 372, a piezoelectric strain occurs in the piezoelectric layer 373 sandwiched between the first electrode 371 and the second electrode 372 and the piezoelectric element 37 of FIG. 19 is displaced. Therefore, in the configuration of FIG. 19, a portion where the first electrode 371, the second electrode 372, and the piezoelectric layer 373 overlap each other in plan view corresponds to each of the piezoelectric elements 37.

The first electrode 371 is separately formed on the outer surface of the diaphragm 36 for each of the piezoelectric elements 37 (for each of the nozzles N). Each of the first electrodes 371 is an electrode that extends in the Y-direction. Each of the first electrodes 371 is connected to the drive IC 62 via each of lead electrodes 371A pulled out to the outside of each of the piezoelectric layers 373. The lead electrodes 371A are electrically connected to each other, and each first electrode 371 is a common electrode for the plurality of piezoelectric elements 37.

On an outer surface (outer surface on a side opposite to the diaphragm 36) of each of the first electrodes 371, the piezoelectric layer 373 and the second electrode 372 are separately formed for each of the piezoelectric elements 37 (for each of the nozzles N). As illustrated in FIG. 20, each of the second electrodes 372 is stacked on the first electrode 371 on the side opposite to the diaphragm 36, and each of the piezoelectric layers 373 is stacked so as to be sandwiched between the first electrode 371 and the second electrode 372. Each of the second electrodes 372 is an electrode that extends in the Y-direction. Each of the second electrodes 372 is separately connected to the drive IC 62 via each of the lead electrodes 372A pulled out to the outside of each of the piezoelectric layers 373.

The piezoelectric layer 373 is formed by being patterned for each of the pressure chambers C. Each of the second electrodes 372 is provided on a surface of each of the piezoelectric layers 373 on a side opposite to each of the first electrodes 371, and configures a separate electrode corresponding to each of the plurality of piezoelectric elements 37. Each of the second electrodes 372 may be directly provided on each of the piezoelectric layers 373, or other members may be sandwiched between the piezoelectric layers 373 and the second electrodes 372. Materials of the first electrodes 371, the second electrodes 372, and the piezoelectric layers 373 of the embodiment are the same as the materials in the third embodiment.

A case where in the piezoelectric elements 37 of the embodiment, the first electrodes 371 are set as common electrodes for the plurality of piezoelectric elements 37 and the second electrodes 372 are set as separate electrodes corresponding to the plurality of piezoelectric elements 37 is given as an example. Without being limited to the configuration, however, the second electrodes 372 may be set as common electrodes for the plurality of piezoelectric elements 37 and the first electrodes 371 may be set as separate electrodes corresponding to the plurality of piezoelectric elements 37. Although a case where the diaphragm 36 is configured of a single layer is given as an example in the embodiment described above, the diaphragm may be configured of a plurality of layers without being limited thereto.

As illustrated in FIG. 19, the shapes of the pressure chambers C of the embodiment are squares which are the same as the pressure chambers C of FIG. 17. The piezoelectric elements 37 of the embodiment each overlap the center O of the pressure chamber C in plan view, and are square elements of which each outer periphery is smaller than the pressure chamber C. The diaphragm 36 of FIG. 19 is configured of the single crystal silicon substrate having the crystal plane of FIG. 6 or 7. In the piezoelectric elements 37 of FIG. 19, the width of each piezoelectric element 37 in the first direction is larger than the width of each piezoelectric element 37 in the second direction in a case where a Young's modulus in the first direction (for example, the W direction) is higher than a Young's modulus in the second direction (for example, the X-direction or the Y-direction) in the crystal plane, as in the configuration of FIG. 4. When the width of each piezoelectric element 37 in each of the directions along the axis Gx, the axis Gy, the axis Gw, and the axis Gw' is set as Tx, Ty, Tw, and Tw', respectively, the width Tw along the axis Gw is equal to the width Tw' along the axis Gw', and the width Tx along the axis Gx is equal to the width Ty along the axis Gy, as in the configuration of FIG. 4. The width Tw and the width Tw' are larger than the width Tx and the width Ty. By configuring in such a manner, a deflection amount of the diaphragm 36 in the in-plane direction can be increased in a direction where a Young's modulus is high, which is a direction where the displacement of the diaphragm 36 is likely to be obstructed, also by the piezoelectric elements 37 being disposed on the center portions of the pressure chambers C. Therefore, the displacement efficiency of the diaphragm 36 can be improved.

A case where the pressure chamber substrate 34 and the diaphragm 36 are configured as separate bodies is given as an example in the embodiment. Without being limited thereto, the pressure chamber substrate 34 and the diaphragm 36 may be integrated with each other so as to form the pressure chambers C and the diaphragm 36 at once, for example, as in a modification example of the fourth embodiment illustrated in FIG. 21. In a configuration of FIG. 21, by selectively removing, in accordance with a crystal orientation, a part of a region corresponding to each of the pressure chambers C in a thickness direction from a single crystal silicon base having a predetermined thickness, the pressure chambers C and the diaphragm 36 can be formed at once.

Figure 21:
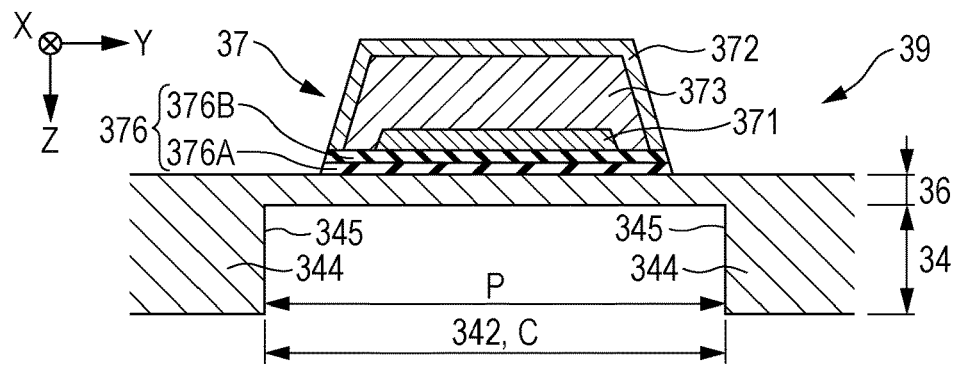
FIG. 21 is a sectional view of a piezoelectric device according to a modification example of the fourth embodiment.

In the configuration of FIG. 21, adhesive layers 376 for ensuring adhesion are provided between the piezoelectric elements 37 and the diaphragm 36. Each of the adhesive layers 376 of FIG. 21 is formed of a silicon oxide film 376A and a zirconia oxide film 376B. Each of the silicon oxide films 376A and each of the zirconia oxide films 376B are stacked in this order on the diaphragm 36. Since the adhesive layer 376 has toughness higher than single crystal silicon that configures the diaphragm 36, the adhesive layers are made as thin as possible and are made so as not to be formed in portions close to the inner peripheries 345 in the direction of the short axis Gy as illustrated in FIG. 21. By adopting the configuration described above, the displacement efficiency of the piezoelectric device 39 can be improved since the portions close to the inner peripheries 345 of the pressure chambers C are likely to deform compared to a case where the adhesive layers 376 each are formed over the entire vibration region P.

Modification Example

The forms and the embodiments given as examples above can be variously changed. Examples of forms of specific deformation are given as follows. Any two or more forms selected from the following examples and the forms described above can be combined as appropriate unless the selected forms are inconsistent with each other.

(1) Although a serial head that repeatedly causes the carriage 242, on which the liquid discharging heads 26 are mounted, to reciprocate in the X-direction is given as an example in the embodiments described above, the invention is also applicable to a line head in which the liquid discharging heads 26 are arranged over the entire width of the medium 12.

(2) Although the piezoelectric liquid discharging heads 26, in which the piezoelectric elements mechanically vibrating the pressure chambers are used, are given as an example in the embodiments described above, it is also possible to adopt thermal liquid discharging heads in which heating elements generating bubbles inside the pressure chambers by heating are used.

(3) The liquid discharging apparatus 10 given as an example in the embodiments described above can be adopted in various types of devices such as a facsimile device and a copier, in addition to a device exclusive to printing. The use of the liquid discharging apparatus 10 of the invention is not limited to printing. For example, a liquid discharging apparatus that discharges a color material solution is used as a manufacturing apparatus that forms a color filter of a liquid crystal display device, an organic electroluminescent (EL) display, and a field emission display (FED). A liquid discharging apparatus that discharges a conductive material solution is used as a manufacturing apparatus that forms wiring of a wiring substrate and an electrode. In addition, the liquid discharging apparatus is also used as a chip manufacturing apparatus that discharges a bioorganic solution as a type of a liquid.

What is claimed is:

1. A piezoelectric device comprising:
   a pressure chamber;
   a piezoelectric element; and
   a diaphragm disposed between the pressure chamber and the piezoelectric element,
   wherein the diaphragm has a crystal plane of an anisotropic single crystal silicon base of which a Young's modulus varies according to a direction in the crystal plane,
   wherein, in a first direction, a width of the piezoelectric element is a first width, and Young's modulus of the crystal plane is a first Young's modulus, and
   wherein, in a second direction that crosses the first direction, a width of the piezoelectric element is a second width that is smaller than the first width, Young's modulus of the crystal plane is a second Young's modulus that is smaller than the first young's modulus.

2. The piezoelectric device according to claim 1,
   wherein the first width of the piezoelectric element is a width of a portion of the piezoelectric element in the first direction, which overlaps the pressure chamber in plan view.

3. The piezoelectric device according to claim 1,
   wherein the first width of the piezoelectric element is a width of a portion of the piezoelectric element in the first direction, which overlaps a side wall of the pressure chamber in plan view.

4. The piezoelectric device according to claim 1, comprising:
   wherein a width of the piezoelectric element in a direction of a short axis of rectangle, which includes the vibration region, is larger than a width of the pressure chamber in a direction of a long axis of the rectangle.

5. The piezoelectric device according to claim 1,
   wherein the piezoelectric element is disposed on the diaphragm so as to overlap an inner periphery of the pressure chamber without overlapping a center of the pressure chamber in plan view, and
   the piezoelectric element has an inner edge on a center side of the pressure chamber and has an outer edge on a side wall side of the pressure chamber with the inner periphery of the pressure chamber being sandwiched between the outer edge and the inner edge in plan view.

6. The piezoelectric device according to claim 5,
   wherein an entire perimeter of the piezoelectric element overlaps an entire perimeter of the inner periphery of the pressure chamber in plan view.

7. The piezoelectric device according to claim 6,
   wherein a shape of the inner edge or the outer edge of the piezoelectric element is a polygon or a circle in plan view.

8. The piezoelectric device according to claim 6,
   wherein a shape of the inner periphery of the pressure chamber is a polygon or a circle in plan view.

9. The piezoelectric device according to claim 1,
   wherein the single crystal silicon base is a base of which the crystal plane is a {100} plane,
   the first direction lies along a crystal orientation <011> in the crystal plane, and
   the second direction lies along a crystal orientation <001> in the crystal plane.

10. The piezoelectric device according to claim 1,
    wherein the single crystal silicon base is a base of which the crystal plane is a {110} plane,
    the first direction lies along a crystal orientation <111> in the crystal plane, and
    the second direction lies along a crystal orientation <001> in the crystal plane.

11. A liquid discharging head comprising:
    the piezoelectric device according to claim 1,
    wherein a liquid that has filled the pressure chamber is discharged from a nozzle by the piezoelectric element vibrating the diaphragm to change a pressure of the pressure chamber.

12. A liquid discharging apparatus comprising:
    the liquid discharging head according to claim 11, and
    a controller that controls discharging from the liquid discharging head.

13. The piezoelectric device according to claim 4,
    wherein the first width and the second width are larger than a width of the piezoelectric element in the direction of the long axis.

14. The piezoelectric device according to claim 1,
    wherein the second width of the piezoelectric element is a width of a portion of the piezoelectric element in the second direction, which overlaps the pressure chamber in plan view.

15. The piezoelectric device according to claim 1,
    wherein the second width of the piezoelectric element is a width of a portion of the piezoelectric element in the second direction, which overlaps a side wall of the pressure chamber in plan view.

16. The piezoelectric device according to claim 1,
    wherein the piezoelectric element has an annular shape.

17. The piezoelectric device according to claim 1,
    wherein the first Young's modulus in the first direction is a maximum out of Young's modulus in the crystal plane.

18. The piezoelectric device according to claim 1,
    wherein the second Young's modulus in the second direction is a minimum out of Young's modulus in the crystal plane.

* * * * *